US010048676B2

(12) United States Patent
Henning et al.

(10) Patent No.: US 10,048,676 B2
(45) Date of Patent: Aug. 14, 2018

(54) GENERATING OPTIMIZED TOOL PATHS AND MACHINE COMMANDS FOR BEAM CUTTING TOOLS

(71) Applicant: OMAX Corporation, Kent, WA (US)

(72) Inventors: Axel H. Henning, Black Diamond, WA (US); James M. O'Connor, Bellevue, WA (US)

(73) Assignee: OMAX Corporation, Kent, WA (US)

( * ) Notice: Subject to any disclaimer, the term of this patent is extended or adjusted under 35 U.S.C. 154(b) by 572 days.

(21) Appl. No.: 14/333,475

(22) Filed: Jul. 16, 2014

(65) Prior Publication Data
US 2015/0205293 A1 Jul. 23, 2015

Related U.S. Application Data

(60) Provisional application No. 61/930,447, filed on Jan. 22, 2014.

(51) Int. Cl.
*G05B 19/4097* (2006.01)
*G06F 17/50* (2006.01)
*B24C 1/04* (2006.01)
*G05B 19/414* (2006.01)

(52) U.S. Cl.
CPC .......... *G05B 19/4097* (2013.01); *B24C 1/045* (2013.01); *G05B 19/4145* (2013.01); *G06F 17/5009* (2013.01); *G05B 2219/45036* (2013.01); *Y02P 90/265* (2015.11)

(58) Field of Classification Search
CPC ............ G05B 19/4097; G05B 19/4145; G05B 2219/45036; G06F 17/5009; B24C 1/045; Y02P 90/265
See application file for complete search history.

(56) References Cited

U.S. PATENT DOCUMENTS

| 5,508,596 | A | 4/1996 | Olsen |
| 5,854,744 | A | 12/1998 | Zeng |
| 5,986,425 | A | 11/1999 | Onishi et al. |
| 6,120,351 | A * | 9/2000 | Zeng ...................... B24C 1/045 |
| | | | 451/2 |
| 6,243,625 | B1 | 6/2001 | Wyatt et al. |
| 6,616,372 | B2 | 9/2003 | Seroka et al. |
| 6,766,216 | B2 | 7/2004 | Erichsen et al. |
| 6,922,605 | B1 | 7/2005 | Olsen |
| 7,035,708 | B1 * | 4/2006 | Olsen ...................... B24C 1/045 |
| | | | 409/329 |

(Continued)

OTHER PUBLICATIONS

Non-Final Office Action dated Sep. 10, 2015 from the U.S. Patent Office for U.S. Appl. No. 14/333,470, filed Jul. 16, 2014, first named inventor: Axel H. Henning, 23 pages.

(Continued)

*Primary Examiner* — Nathan L Laughlin
(74) *Attorney, Agent, or Firm* — Perkins Coie LLP

(57) ABSTRACT

A facility for automated modelling of the cutting process for a particular material to be cut by a beam cutting tool, such as a waterjet cutting system, from empirical data to predict aspects of the waterjet's effect on the workpiece across a range of material thicknesses, across a range of cutting geometries, and across a range of cutting quality levels, all of which may be broader than, and independent of the actual requirements for a target workpiece, is described.

19 Claims, 15 Drawing Sheets

(56) References Cited

U.S. PATENT DOCUMENTS

| | | | |
|---|---|---|---|
| 8,423,172 B2 | 4/2013 | Erichsen et al. | |
| 8,676,372 B1 | 3/2014 | Bolin et al. | |
| 9,573,289 B2 | 2/2017 | Hashish et al. | |
| 9,658,613 B2 | 5/2017 | Henning et al. | |
| 9,720,399 B2 | 8/2017 | Henning et al. | |
| 9,727,051 B2 | 8/2017 | Henning et al. | |
| 9,772,620 B2 | 9/2017 | Henning et al. | |
| 9,891,617 B2 | 2/2018 | Henning et al. | |
| 2002/0066345 A1 | 6/2002 | Shepherd et al. | |
| 2003/0065424 A1 | 4/2003 | Erichsen et al. | |
| 2007/0037496 A1 | 2/2007 | Habermann et al. | |
| 2009/0071303 A1 | 3/2009 | Hashish et al. | |
| 2009/0272245 A1* | 11/2009 | Voice | B24C 1/00 83/875 |
| 2009/0325468 A1* | 12/2009 | El-Wardany | B23P 15/006 451/38 |
| 2010/0267314 A1 | 10/2010 | Cvjeticanin | |
| 2011/0287692 A1 | 11/2011 | Erichsen et al. | |
| 2011/0294401 A1* | 12/2011 | Habermann | B24C 1/045 451/5 |
| 2012/0021676 A1 | 1/2012 | Schubert et al. | |
| 2012/0022839 A1 | 1/2012 | Valicek | |
| 2012/0065769 A1 | 3/2012 | Knaupp et al. | |
| 2013/0345853 A1 | 12/2013 | Berman et al. | |
| 2014/0030963 A1 | 1/2014 | Kanazawa | |
| 2014/0045409 A1 | 2/2014 | Zhang et al. | |
| 2015/0134093 A1 | 5/2015 | Dos Reis Alipio Da Cruz | |
| 2015/0205289 A1 | 7/2015 | Henning et al. | |
| 2015/0205290 A1 | 7/2015 | Henning et al. | |
| 2015/0205291 A1 | 7/2015 | Henning et al. | |
| 2015/0205292 A1 | 7/2015 | Henning et al. | |
| 2015/0205295 A1 | 7/2015 | Henning et al. | |
| 2015/0205296 A1 | 7/2015 | Henning et al. | |
| 2017/0255184 A1 | 9/2017 | Henning et al. | |
| 2017/0322543 A1 | 11/2017 | Henning et al. | |

OTHER PUBLICATIONS

International Search Report and Written Opinion for PCT Application No. PCT/US2015/012524 filed Jan. 22, 2015, dated Apr. 30, 2015, 26 pages.

Final Office Action dated Apr. 19, 2016 from the U.S. Patent Office for U.S. Appl. No. 14/333,470, filed Jul. 16, 2014, first name Inventor: Axel H. Henning, 25 pages.

Non-Final Office Action dated Aug. 17, 2016 from the U.S. Patent Office for U.S. Appl. No. 14/333,468, filed Jul. 16, 2014, first named inventor: Axel H. Henning, 16 pages.

Non-Final Office action dated Jul. 22, 2016 from the U.S. patent Office for U.S. Appl. No. 14/333,466, first named Inventor: Axel H. Henning, 14 pages.

Notice of Allowance dated Feb. 7, 2017 from the U.S. Patent Office for U.S. Appl. No. 14/333,469, filed Jul. 16, 2014, first named Inventor: Axel H. Henning, 16 pages.

Notice of Allowance dated Jan. 20, 2017 from the U.S. Patent Office for U.S. Appl. No. 14/333,466, filed Jul. 16, 2014, first named Inventor: Axel H. Henning, 11 pages.

Notice of Allowance dated Feb. 15, 2017 from the U.S. Patent Office for U.S. Appl. No. 14/333,468, filed Jul. 16, 2014, first named Inventor: Axel H. Henning, 11 pages.

Non-Final Office Action dated Feb. 27, 2017 from the U.S. Patent Office for U.S. Appl. No. 14/602,227, filed Jul. 21, 2015, first named Inventor: Axel H. Henning, 11 pages.

U.S. Appl. No. 15/601,964, filed May 22, 2017, Henning et al.

Non-Final Office Action dated Jun. 16, 2017 from the U.S. Patent Office for U.S. Appl. No. 14/333,470, filed Jul. 16, 2014, first named Inventor: Axel H. Henning, 33 pages.

Notice of Allowance dated Jun. 12, 2017 from the U.S. Patent Office for U.S. Appl. No. 14/333,468, filed Jul. 16, 2014, first named Inventor: Axel H. Henning, 12 pages.

Notice of Allowance dated Apr. 19, 2017 from the U.S. Patent Office for U.S. Appl. No. 14/602,227, filed Jan. 21, 2015, first named Inventor: Axel H. Henning, 12 pages.

Non-Final Office Action dated Apr. 27, 2017 from the U.S. Patent Office for U.S. Appl. No. 14/565,318, filed Dec. 9, 2014, first named Inventor: Axel H. Henning, 29 pages.

U.S. Appl. No. 15/713,451, filed Sep. 22, 2017, Henning et al.

Notice of Allowance dated Sep. 13, 2017 from the U.S. Patent Office for U.S. Appl. No. 14/333,470, filed Jul. 16, 2014, first named Inventor: Axel H. Henning, 22 pages.

Final Office Action dated Jul. 31, 2017 from the U.S. Patent Office for U.S. Appl. No. 14/565,318, filed Dec. 9, 2014, first named Inventor: Axel H. Henning, 13 pages.

U.S. Appl. No. 15/669,728, filed Aug. 4, 2017, Henning et al.

Extended European Search Report dated Dec. 21, 2017 from the European Patent Office for European Application No. 15741052.3, Applicant: Omax Corporation, 6 pages.

Notice of Allowance dated Oct. 16, 2017 from the U.S. Patent Office for U.S. Appl. No. 14/565,318, filed Dec. 9, 2014, first named Inventor: Axel H. Henning, 9 pages.

* cited by examiner

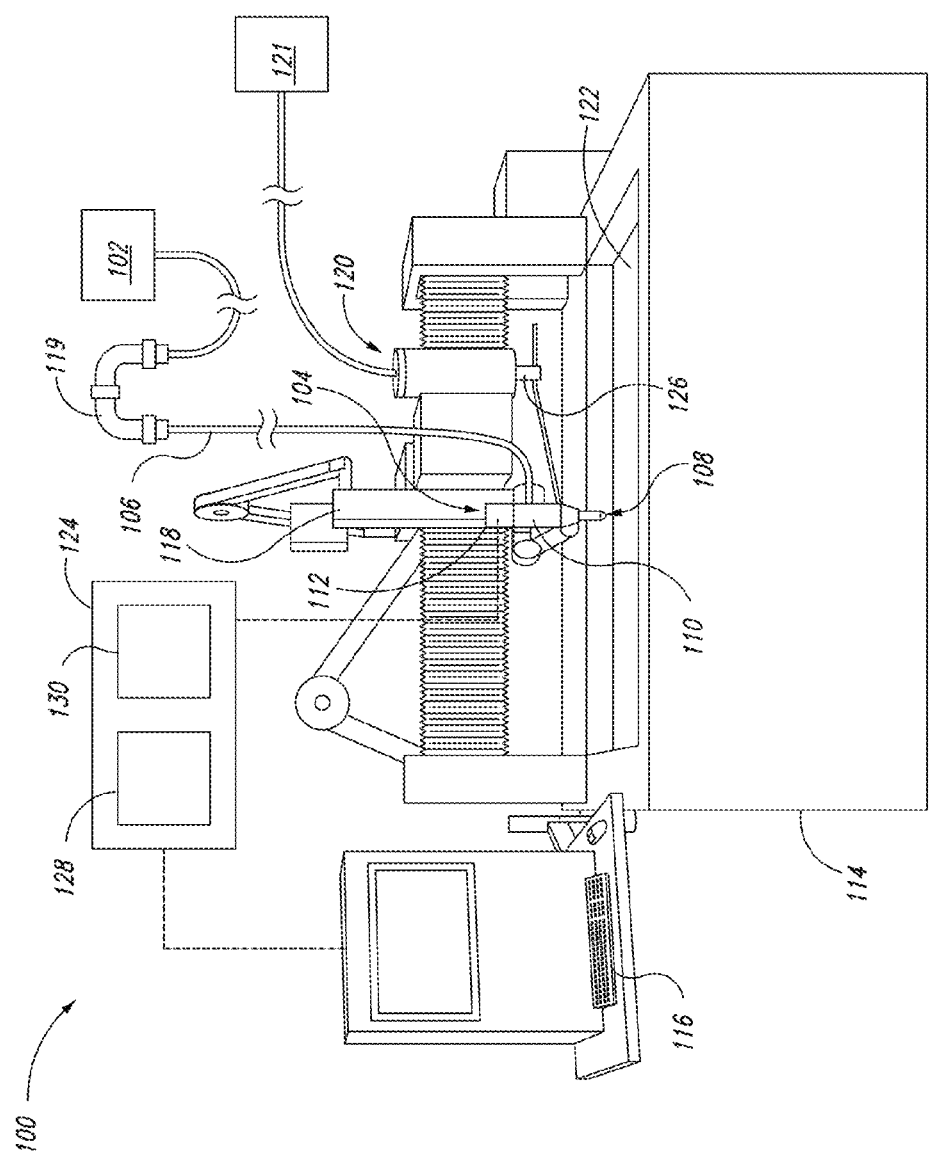

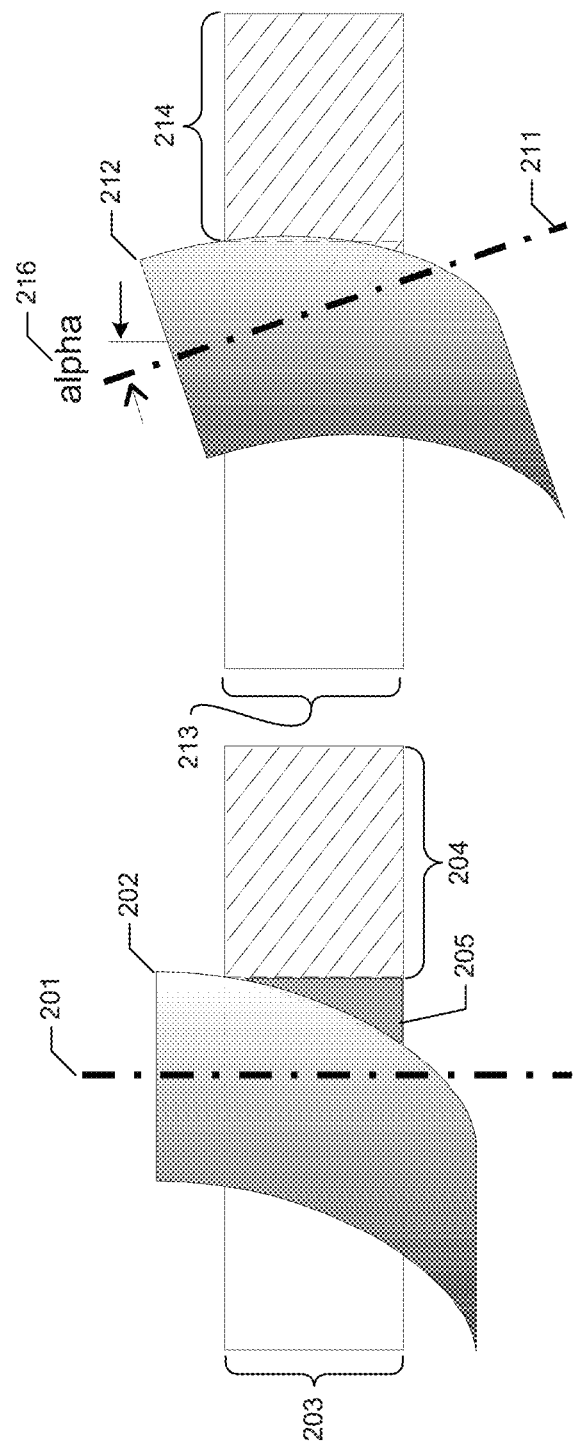

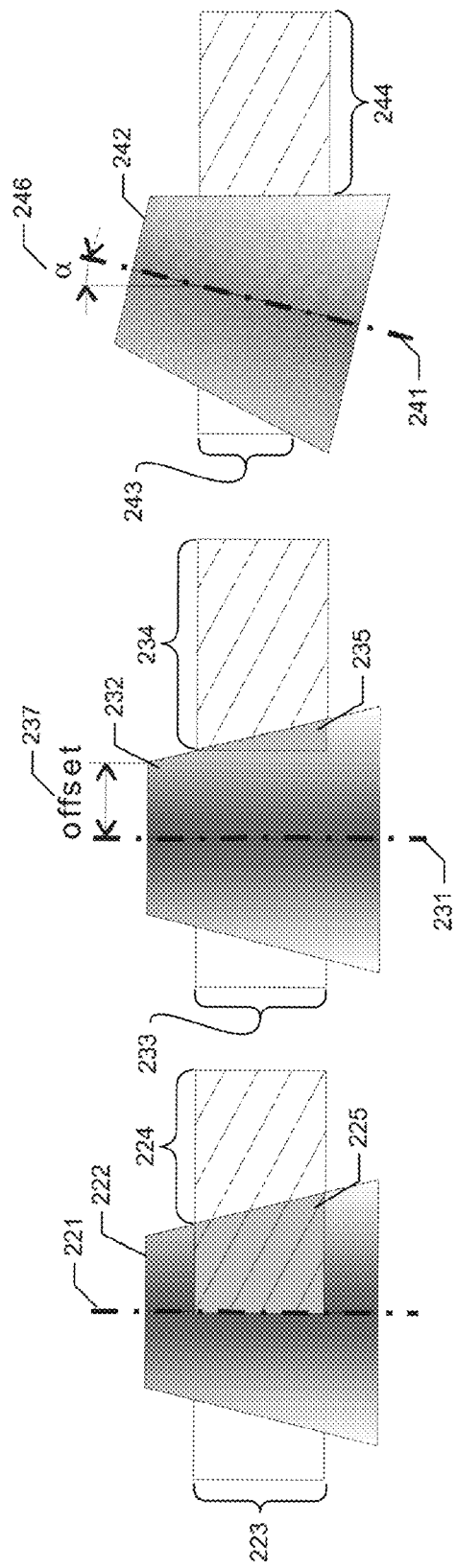

last update time: 1/12/2015 9:08:13 observation table 700

| ID | timestamp | source | material type | material index | operating parameters | test type | depth parameter | speed parameter | measurement | |
|---|---|---|---|---|---|---|---|---|---|---|
| 45646 | 01/09/2015 15:01:06 | manufacturer | polycarbonate | 517 | | separation speed | 8 mm | | 6.1 mm / sec | 701 |
| 45678 | 01/10/2015 06:14:13 | manufacturer | polycarbonate | 517 | | separation speed | 10 mm | | 4.7 mm / sec | 702 |
| 46798 | 01/11/2015 18:22:01 | customer A | polycarbonate | 517 | | jetlag | 2.0 mm | 2.0 mm /sec | 0.41 mm | 703 |
| 46897 | 01/11/2015 18:22:01 | customer A | polycarbonate | 517 | | jetlag | 4.0 mm | 2.0 mm /sec | 0.62 mm | 704 |
| 46971 | 01/11/2015 18:22:01 | customer A | polycarbonate | 517 | | jetlag | 6.0 mm | 2.0 mm /sec | 0.81 mm | 705 |
| 47748 | 01/11/2015 18:22:01 | customer A | polycarbonate | 517 | | jetlag | 2.0 mm | 4.0 mm /sec | 0.10 mm | 706 |
| 48791 | 01/11/2015 18:22:01 | customer A | polycarbonate | 517 | | jetlag | 4.0 mm | 4.0 mm /sec | 0.5 mm | 707 |
| 48794 | 01/11/2015 18:22:01 | customer A | polycarbonate | 517 | | jetlag | 6.0 mm | 4.0 mm /sec | 0.9 mm | 708 |
| 50132 | 01/12/2015 09:07:03 | customer B | polycarbonate | 517 | | taper | 3.0 mm | 1.0 mm / sec | -.04 mm | 709 |
| 50135 | 01/12/2015 09:08:13 | customer B | polycarbonate | 517 | | taper | 4.0 mm | 1.0 mm / sec | .02 mm | 710 |
| 51567 | 01/12/2015 09:07:03 | customer B | polycarbonate | 517 | | taper | 5.0 mm | 1.0 mm / sec | .05 mm | 711 |
| 51678 | 01/12/2015 09:08:13 | customer B | polycarbonate | 517 | | taper | 3.0 mm | 2.0 mm /sec | -.02 mm | 712 |
| 51567 | 01/12/2015 09:07:03 | customer B | polycarbonate | 517 | | taper | 4.0 mm | 2.0 mm /sec | .04 mm | 713 |
| 51678 | 01/12/2015 09:08:13 | customer B | polycarbonate | 517 | | taper | 5.0 mm | 2.0 mm /sec | .07 mm | 714 |

*FIG. 7*

FIG. 11 cutting model table 1100

| ID | timestamp | material type | material index | operating parameters | model type | speed parameter | coefficient 1 | coefficient 2 | coefficient 3 | coefficient 4 |
|---|---|---|---|---|---|---|---|---|---|---|
| 5646 | 01/09/2015 20:01:06 | polycarbonate | 5:17 | | separation speed | | 1.62 | 0.96 | | |
| 5646 | 01/09/2015 20:01:06 | polycarbonate | 5:17 | | jetlag | 2.0 mm/sec | 4.12 | 3.11 | -0.34 | |
| 5646 | 01/09/2015 20:01:06 | polycarbonate | 5:17 | | jetlag | 4.0 mm/sec | 3.22 | 4.11 | 0.22 | |
| 5646 | 01/09/2015 20:01:06 | polycarbonate | 5:17 | | taper | 2.0 mm/sec | 0.78 | 1.22 | 6.78 | 0.05 |
| 5646 | 01/09/2015 20:01:06 | polycarbonate | 5:17 | | taper | 4.0 mm/sec | 0.87 | 2.21 | 7.55 | 1.78 |
| 5646 | 01/09/2015 20:01:06 | polycarbonate | 5:17 | | taper | 6.0 mm/sec | 0.94 | 4.05 | 11.29 | 3.67 |
| 6868 | 01/11/2015 18:22:01 | polycarbonate | 5:17 | | separation speed | | 1.94 | 0.88 | | |
| 6868 | 01/11/2015 18:22:01 | polycarbonate | 5:17 | | jetlag | 2.0 mm/sec | 4.13 | 5.26 | 0.45 | |
| 6868 | 01/11/2015 18:22:01 | polycarbonate | 5:17 | | jetlag | 4.0 mm/sec | 5.72 | 3.66 | 0.67 | |
| 6868 | 01/11/2015 18:22:01 | polycarbonate | 5:17 | | taper | 2.0 mm/sec | 0.88 | 2.31 | 2.87 | -3.61 |
| 6868 | 01/11/2015 18:22:01 | polycarbonate | 5:17 | | taper | 4.0 mm/sec | 0.94 | 4.15 | 3.54 | -0.42 |
| 6868 | 01/11/2015 18:22:01 | polycarbonate | 5:17 | | taper | 6.0 mm/sec | 1.07 | 8.74 | 5.88 | 2.87 |

GENERATING OPTIMIZED TOOL PATHS AND MACHINE COMMANDS FOR BEAM CUTTING TOOLS

CROSS-REFERENCE TO RELATED APPLICATIONS INCORPORATED BY REFERENCE

This application claims the benefit of U.S. Provisional Application No. 61/930,447 filed Jan. 22, 2014. This application is also related to the following applications filed on Jul. 16, 2014 and titled GENERATING OPTIMIZED TOOL PATHS AND MACHINE COMMANDS FOR BEAM CUTTING TOOLS: U.S. patent application Ser. No. 14/333,455, U.S. patent application Ser. No. 14/333,469, now U.S. Pat. No. 9,720,399, U.S. patent application Ser. No. 14/333,466, now U.S. Pat. No. 9,658,613, U.S. patent application Ser. No. 14/333,468, now U.S. Pat. No. 9,772,620, and U.S. patent application Ser. No. 14/333,470, now U.S. Pat. No. 9,891,617. The foregoing applications are incorporated herein by reference in their entireties. To the extent the foregoing applications or any other material incorporated herein by reference conflicts with the present disclosure, the present disclosure controls.

TECHNICAL FIELD

The described technology is directed to the field of controlling a beam cutter, such as an abrasive-jet machining system or other waterjet machining systems.

BACKGROUND

Many common types of computer numerical control ("CNC") machine tools can generally be described as rigid hard cutting tools. These traditional machine tools employ hard tooling, generally metal, which spins rapidly about one or more spindles to sculpt or chip away at a target workpiece, while moving forward along a target tool path, generally at a set speed, all as designated by a computer aided manufacturing (CAM) program and the operating parameters of the machine tool employed. Multiple tooling passes typically occur along the same tool path geometry, so that the workpiece gradually takes the intended or target shape, from the chiseling that occurs with each successive sculpting pass of the spinning rigid hard tooling. Other than dulling/losing consistent sharpness, the rigid hard tooling maintains its original shape throughout the machining process.

A separate class of CNC cutting tools that do not employ rigid hard tooling are referred to as beam cutters. In such beam cutters, a beam, employing plasma, waterjet, torch (such as oxyacetylene), or laser, as examples, and operating along a defined tool path, either erodes (waterjet or abrasive-jet) or melts (laser, plasma, or torch) a workpiece, in some cases through the entire thickness of the workpiece. Etching, engraving, blind hole or pocket milling strategies may also be employed.

For beam cutter machine tools, the cutting head is generally never in actual physical contact with the workpiece, but rather hovering just near the workpiece, with the cutting beam directed against the workpiece surface. Beam cutter machine tools exhibit unique cutting characteristics, in that the cutting beam itself is not rigid (differing from hard rigid tooling) and may exhibit multiple changes in shape along a given tool path, as influenced by, among various factors, the energy of the beam cutter itself; the geometry; thickness and target workpiece material.

Waterjet cutting systems and other fluid cutting systems are examples of beam cutter machine tools. Waterjet cutting systems, such as abrasive-jet cutting systems, are used in precision cutting, piercing, shaping, carving, reaming, etching, milling, eroding and other material-processing applications. During operation, waterjet cutting systems typically direct a high-velocity jet of fluid (e.g., water) toward a workpiece to rapidly erode portions of the workpiece. Depending upon the resistance to the cutting process of a particular target workpiece material, abrasive material can be added to the fluid to enable and/or to increase the rate of erosion. When compared to other material-processing systems (e.g., grinding systems, plasma-cutting systems, etc.) waterjet cutting systems can have significant advantages. For example, waterjet cutting systems often produce relatively fine and clean cuts, typically without heat-affected zones around the cuts. Waterjet cutting systems also tend to be highly versatile with respect to the material type of the workpiece. The range of materials that can be processed using waterjet cutting systems includes very soft materials (e.g., rubber, foam, balsa wood, and paper) as well as very hard materials (e.g., stone, ceramic, and metal). Furthermore, in many cases, waterjet cutting systems are capable of executing demanding material-processing operations while generating little or no dust, smoke, and/or other potentially toxic byproducts.

In order to perform a cutting project using a waterjet cutting system, it is typical to provide a stream of machine commands and related control signals (hereafter simply "machine commands") to the waterjet cutting system. These include turning the jet on, turning the jet off, moving the source of the jet in two-dimensional or three-dimensional space in a particular direction and speed, and rotating the source of the jet or the workpiece or both in one or more dimensions relative to its movement. A variety of approaches are used to generate such a stream of machine commands that will cause a waterjet cutter to process a workpiece in a manner consistent with a cutting design specifying the size, quality, and shape of elements of the post-processed workpiece.

In a similar manner, beam cutter machine tools of other types are also controlled by providing stream of machine commands, including turning the beam on, turning the beam off, moving the source of the beam in two-dimensional or three-dimensional space in a particular direction and speed, rotating the source of the beam or the workpiece in one or more dimensions relative to its movement, modulating the energy, diameter, flow rate, cross-sectional shape, and/or other attributes of the beam.

BRIEF DESCRIPTION OF THE DRAWINGS

FIG. 1 is a perspective view illustrating a waterjet system configured for use with the facility in some embodiments.

FIGS. 2A-2E are processing diagrams that illustrate the effect of waterjet cutting tool on the shape of the resulting workpiece and the use of tilting to compensate for them.

FIG. 7 is a table diagram showing example contents of an observation table used by the facility, in some embodiments, to store information about observations contained in the facility's observation repository.

FIG. 11 is a table diagram showing sample contents of a cutting model table used by the facility in some embodiments to store cutting models generated by the facility for future reuse.

DETAILED DESCRIPTION

Overview

Figure 3:
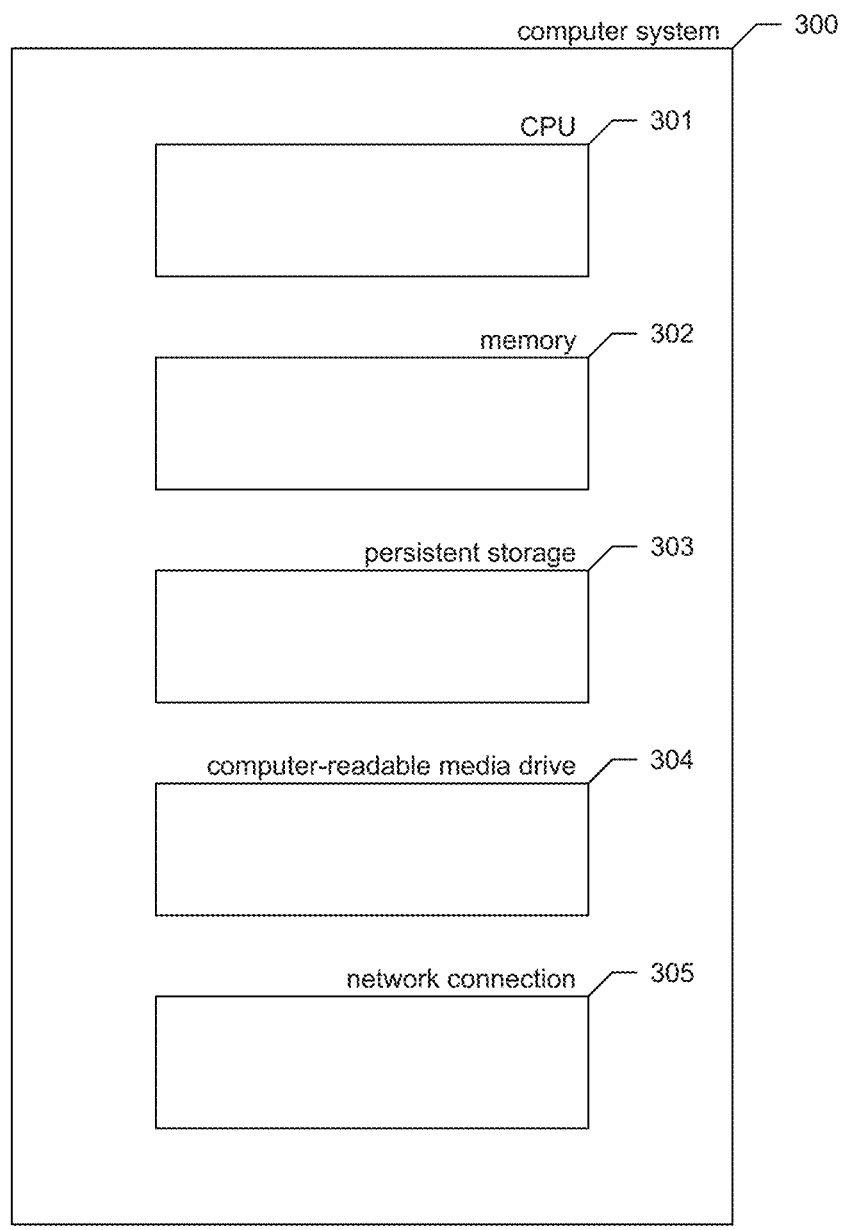
FIG. 3 is a block diagram showing some of the components typically incorporated in at least some of the clients, servers, and other devices on which the facility operates.

In beam cutting applications, such as applications using waterjets, modelling of the expected workpiece geometry has been a basis for more effectively generating tool machine commands control signals that allow a user to perform a cutting project. In some cases, such modeling may encompass determining the cutting speed that would allow the jet to separate the material or to generate a part according to specifications for the project. Conventional modeling techniques typically use a predefined model, (such as one or more pre-set algorithms), of the beam's behavior or the result upon the workpiece, that is dependent on a fixed set of workpiece parameters: geometry, thickness, material type, and cutting results desired (one or more quality parameters, such as dimensional accuracy; absence or introduction of taper; surface finish, etc.). With mostly predetermined conventional modeling techniques, a unique static solution of motion control instructions specific to the active operating parameters that are being employed and workpiece machining objectives, is generated using the specific workpiece parameters that were all identified at the outset. If a workpiece parameter, such as its geometry or thickness, or an operating parameter, such as garnet flow rate, is subsequently changed, the modeling process starts again from the beginning in order to develop a unique solution for that specifically defined set of workpiece and/or operating parameters used to describe part created by the project. Conventional models often make use of arbitrary "constants" or other correction factors, which can introduce subjective biases into the models.

The inventors have recognized that such conventional modeling techniques were typically narrow in focus (for example, modelling the effects of speed only), and might be for a limited and fixed set of parameters (such as material, pressure, etc.); and generally not well-disposed to rapid optimization. For example, conventional modeling techniques do not perform a simultaneous review of differing possible operating parameters, but rather focus only upon the current active operating parameters. The models employed are not teachable to automate their improvement by the introduction of additional empirical data sets. The one-tool-path-at-a-time optimization method requires sequential compilations with vastly increased compiling times, and new operating parameters of the beam cutter technology must be changed either manually or within its own automated sequencing parameter ranges.

The inventors have recognized that many conventional approaches to generating machine commands for beam cutters, such as waterjet cutting systems, have additional significant disadvantages. These often require extensive manual trial, error, and refinement. Also, to the extent that conventional approaches take advantage of empirical experimentation, it is typically necessary for such experimentation to very closely mirror many or all of the conditions under which production cutting is performed. Further, conventional approaches produce machine commands that often result in the expenditure of unnecessary levels of time, consumed substances, electricity, or other scarce or expensive resources, and/or machine commands that produce results of inferior quality. Also, conventional approaches are often closely tailored to a particular set of workpiece or operating parameters such as a specific cutting depth or other tool operating parameters, and a new model, recreating prior modeling steps, typically must be created if any of these is varied significantly.

Accordingly, the inventors have developed a software and/or hardware facility ("the facility") that, in some embodiments, automatically generates a tool path for a beam cutter, such as a waterjet cutting system, or for motion control systems of various other types, which specifies tool path characteristics, such as cutting speeds, throughout the process of cutting or otherwise processing a workpiece. As referred to herein, a waterjet cutting tool may perform waterjet cutting in a manner in which an abrasive substance is injected into the waterjet, and/or in a manner in which no abrasive substance is injected into the waterjet. In various embodiments, the facility is teachable, and encapsulates constantly adjusting and updated algorithms to model the cutting process and produce machine commands, as underlying cutting test data is added from an expanded group of potential sources. In some embodiments, the facility processes this tool path in order to generate a stream of machine commands usable to directly control a tool at a very fine level of resolution. In some embodiments, the facility stores some or all of the tool paths that it generates, and/or some or all of the machine command streams that it generates, in a data structure called a "project control data structure." In some embodiments, this project control data structure further stores one or more cutting models used in generating tool paths stored in the project control data structure. While the use of the facility as a basis for controlling a machine system to perform cutting is described in detail below, one of skill in the art will appreciate that the facility may also be used to control a motion control system to perform other types of processing, including, in various embodiments, piercing, shaping, carving, milling, reaming, etching, and eroding.

In some embodiments, the facility constructs a statistical model, which is relied upon to generate a tool path. In particular, the facility's descriptive model of the resultant cut edge on the part formed by the beam uses results of cutting test made on a beam cutter, such as a waterjet machining system, typically with statistical confirmation to high certainty, permitting high confidence in the part program generated using the facility's model. In various embodiments, the cutting tests and resulting observations used by the facility in model generation include measurements that provide information about the nature and performance of the cutting tool in connection with various processing operations, including such processing operations as cutting, piercing, shaping, carving, milling, reaming, etching, and eroding. Any individual or system involved with generation of more empirical data can continue to teach the model, providing more input data, increasingly improving the statistical confidence of the modeling process for the material under study. In some embodiments, the facility may automatically generate multiple possible models, which may, for example, suggest other possible operating parameters, for the user's consideration, such as to achieve fastest cutting, or (perhaps different) most economical cutting, or to meet other user objectives.

In some embodiments, the descriptive model constructed by the facility is based only upon the operating parameters of the beam cutting technology employed (for abrasive-waterjet: pressure, fluid (such as water) flow rate, abrasive type, abrasive size, abrasive flow rate and others), and the material to be cut or otherwise machined. In some embodiments, the models generated by the facility are not dependent on any specific part geometry, material thickness, or selected operational parameters. In generating a model, empirical cutting data is used to determine, for each of a number of different aspects of the beam's effect on a workpiece is embedded within the modeling process, a function or other relation that predicts a value for the aspect—or "dependent variable"—based on the value(s) of one or more independent variables. In some embodiments, these modeled aspects include separation speed, jet lag, kerf width, taper error, surface finish, geometry, and position of the cutting front or other beam cutting effects such as maximum cutting depth.

At the start, from the empirical cutting data available for the specific material, a descriptive mathematical function of the effect of the beam cutter, such as a waterjet machining system, on the workpiece is derived for separation speeds in regard to possible thicknesses and other jet parameters, as limited only by the implicit power of the beam cutter employed, given the possible operating parameters provided. Initially determining one or more descriptive function(s), such as for the "separation speed", then other descriptive functions, to describe other behaviors which are useful to the eventual workpiece tool path, can be derived, such as for the effect of jet lag, etc. All such first level functions can be derived independent of workpiece geometry, thickness, and possibly other operational parameters, which are not yet required.

In some embodiments, the facility relies on a cutting metric with respect to a particular material, thickness, and tool operating procedures called "separation speed." This is, for a given cutting depth, the highest speed at which the jet can move and still completely penetrate the workpiece, such that the two sides of the workpiece are fully separated. In some embodiments, the facility relies on a cutting metric with respect to a particular material, thickness, and tool operating procedures called "cutting depth at specified speed." This is, for a given speed, the depth of material removed by the jet. The cutting process is forming a cut edge on either side of the cut, which will remain after completion of the process. The geometry of the remaining cut edge is determined by the effect of the beam cutting process on the material at the cutting front. This cutting front constitutes the momentary effect of the process on the workpiece at the leading edge of the beam. Its geometric effect is constituted in the resultant cut edge of the workpiece, also referred to as the cut edge of the part or parts created by the processing project.

There are common shape behaviors of the jet that contribute to a geometrical effect on the cut edge of the workpiece noted in beam cutting technologies, and particularly waterjet cutting tools. Such behaviors can include but are not limited to:

1) Jetlag—typically the deviation of the cutting front from the jet vector in the cutting plane. The jetlag typically varies with cutting depth 2) Kerf width—typically the width of the cutting kerf—the void created in the workpiece by the jet—at the top entrance of the jet into the material. The perfect kerf would be formed by a parallel plane to the cutting plane with a distance of half of the kerf width (half the beam's diameter) to the cutting plane.

3) Taper error—typically the deviation of the real cutting front from the perfect parallel kerf, perpendicular to the cutting plane. The taper error typically varies with cutting depth.

4) Surface finish—typically the deviation from the perfect surface in terms of roughness and surface patterns. Surface finish typically varies with cutting depth.

In various embodiments, the facility collects and manages cutting test results, together with the material cut and cutting tool operating parameters used. These cutting test results and the associated information are referred to as "observations."

The facility uses these observations as a basis for generating models that predict how the beam cutting machine, such as a waterjet machining tool, and its jet will affect the formation of a cutting front and thus the ultimate shape of the cut edge of a specific material. Those are, on one hand, dependent on such factors as material type and machine operating parameters, but on the other, independent of such factors as material thickness and an eventual objective workpiece geometric shape and possibly other selected parameters. This quality allows such a model generated by the facility for a particular material type and particular operating parameters to be reused for any subsequent project using the same material type and the same or similar operating parameters, irrespective of differences in such factors as material thickness and geometric cutting shape and possibly other dependent operating parameters such as pressure, abrasive type and size, etc.

In particular, in some embodiments, to generate a model for a cutting project, the facility first selects from its full repository of observations those produced by cutting tests whose material type and operating parameters closely match those specified for the cutting project. The facility enables development of one or more parametric functions based on existing observations and/or physical principles to the selected observations of the corresponding type, determining coefficients for the parametric function that causes it to best represent the behavior of the selectable observations. In some embodiments, the modelling functions which are developed by the facility are cutting speed as a function of material depth (given possible operating parameters for which the beam cutting tool employed is capable of achieving), jetlag as a function both of material depth and cutting speed, and taper as a function both of material depth and cutting speed. In some embodiments, the facility generates the modeling functions by determining coefficients in a manner based on additional factors beyond the selected observations. In some embodiments, material type and/or operating parameters such as pressure, abrasive feedrate and others can be independent variables of the first level modelling functions. In one possible embodiment, the first level functions describe the effect of the jet on the workpiece for a straight line cut without tilting motion or direction change; or alternatively in another exemplary embodiment, including tilting motion or direction change.

In order to generate the second level functions, the facility then models the expected cutting front that generates the geometry of the cut edge for the whole range or a relevant part of non-constant conditions such as cutting depth, speed, direction, angle, parameter changes or other effects that change the expected cutting front and therefore the geometry of the cut edge such as corners, arcs, or bevels. At this point, the cutting model can still be independent of any specific or target workpiece geometry and could be applied to any cutting geometry with same or similar cutting parameters. In some embodiments, the facility receives user input specifying the geometric characteristics of the specific anticipated workpiece, to reduce the possible outcomes calculated by the facility. In various embodiments, the facility receives the geometry of a cutting project as a routed geometry, which consists of a possibly ordered list of cutting and traversing entities that contain but are not limited to information of the intended cutting geometries as value and changes of position, curvature, cutting depth, cutting angles, cutting quality etc. In some embodiments, the cutting depth is included implicitly as workpiece thickness and cutting angle. From the specific geometry, specifications, and tool path of the cutting project, the facility uses the cutting model to derive speed profiles and tool path compensations.

In various embodiments, instead of constructing first- and/or second-level modeling functions that relate modeled dependent variables to corresponding independent variables, the facility constructs relations of a variety of other types that it uses as a basis for predicting a value of the dependent variable based on a value of the independent variable. In various embodiments, these include probability distributions, lookup tables, fuzzy functions, etc.

In some embodiments, the facility manages the observations that it uses as a basis for generating cutting models, allowing a variety of actors to add, and in some cases rate, weight, and/or remove one or more observations in the repository of observations that it maintains and employs. In some embodiments, the facility assigns a rating and/or weight factors to a subject observation based on an analysis and comparison of that observation with pre-existing observations, experience data, physical laws, or other methods. In some embodiments, the facility bases the rating on an assertion of the expected quality of the subject observation from this specific source. In some embodiments, the facility applies this rating individually, or on the basis of a multi-user crowd rating system or other factors. In some embodiments, the facility publishes and/or syndicates observations between different observation repositories, such as those associated with a central service and those associated with actors (for example "end users") directly using the cutting machines. Whatever financial arrangement permits such users of cutting machines to use the observations, and observation repositories (purchase, financed purchase, lease, loan, license, consignment, etc.) such users are referred to herein as "tool customers." For example, a particular tool customer may perform its own experimentation and (1) add the resulting observations to its own observation repository, and/or (2) add them to a central repository. Depending on its licensing agreement, the tool customer may be allowed to use the central observation repository in its entirety or a part thereof.

This source tool customer may then generate models that gain the benefit of the expanding repository of observations, as may the operator of the central observation repository, and/or other tool customers that subscribe to the central observation repository. The tool customers who use particular observations to generate models may be at an arbitrary distance from the geographic location where the cutting tests reflected in those observations were performed, and in some embodiments may not learn the identity of the actor performing the cutting tests and supplying the observations.

In some embodiments, the source of an observation is compensated for providing it to the central repository. In some cases, observations may be provided by actors whose primary business lies with the performing cutting tests to generate observations and provide them for use by others, either via the central observation repository, or directly to the user or users. In various embodiments, compensation is in a variety of forms, including government-issued currency, banking system credits, or proprietary credits.

In some embodiments, some or all parts of model construction and/or control signal generation is performed as a service by a central service provider, including a provider that operates in a cloud. In some embodiments, users of this service pay a marginal fee for its use. In some embodiments, the service is free for tool customers who are authorized users of a tool provided by a particular tool manufacturer. In some embodiments, the service is capable of providing modeling and/or control signal generation services at differing levels of efficacy (including resource efficiency, and/or result quality), and establishes differential pricing for such services.

In some embodiments, a manufacturer provides a tool to a tool customer at a certain price with a limited set of cutting models, and/or a limited version of the facility for generating cutting models, and charges the tool customer more to use the facility, and/or use less-limited models generated by the facility. In various embodiments, the tool customer pays based on the number and size of cutting projects performed, the number and/or quality of models used, amount of abrasive consumed, a fixed periodic amount for tiered or unlimited service, etc.

In some embodiments, the provider of the facility charges a tool customer for maintenance of and/or updates to the observation repository. In various embodiments, the tool customer pays based on the number of cutting projects performed, the number and/or quality of models used, amount of abrasive consumed, a fixed periodic amount for tiered or unlimited service, etc.

In some embodiments, the facility decomposes control signal generation for a project into portions called "streaks" that each begin with a "beam on" command, contain one or more cutting entities (cutting lines and/or cutting arcs, for example), and end with a "beam off" command, and distributes these streaks to different processing entities for parallel processing.

In some embodiments, the facility suggests variations in tool operating parameters likely to achieve the end user's particular objectives such as for part accuracy, part production time, part cost, equipment usage, and other end user objectives. The facility may incorporate weighting of such objectives, which may otherwise compete. In various embodiments, and for exemplary waterjet machining systems, such variations can include altering focus tube diameters, orifice sizes, garnet types, grades and flow rates, pressures, etc. For example, in some embodiments, the facility tests the variation of varying orifice size by determining the effect of this variation on the model's descriptive functions and, consequently, its effect on estimated cutting accuracy and speed. In some embodiments, the alternative descriptive functional sets are simultaneously retained into memory to compare for the optimum operating parameters, given the later introduction of specific workpiece parameters, including cutting objectives such as the quality requirements.

In some embodiments, a single instance of the facility can be used with respect to tools of a variety of models, and/or with respect to tools from a variety of manufactures.

By operating in some or all of these ways, the facility generates tool paths and machine commands at high levels of automation, resource efficiency, result quality and/or other tool customer objectives. In particular: (1) tool paths can be compiled quickly with relatively small amounts of computing resources because of the focus on functional relationships to describe the resultant cut edge; (2) the modeling process for any material is easily improvable, even by the user/operator, by the submission of new observations; (3) if the user is cutting only one material over and over again, to different geometries and/or thicknesses, the initial levels of functional modeling for that material are already done and may be repeatedly reused; and (4) where a customer uses a modeling and/or control signal generation service, it is relieved of the processing burden of itself conducting this work.

Beam Machining Systems.

FIG. 1 is a perspective view illustrating one type of beam cutter tool, a waterjet machining system 100, configured for use with the facility in some embodiments. The system 100 can include a beam generating source 102 (shown schematically) (e.g., a fluid-pressurizing device, a laser source, or a plasma source) configured to generate a beam for processing through a beam inlet (not shown), with or without being subjected to a conditioning unit (not shown), and with or without being stored in a reservoir (not shown). The system further includes a cutting head assembly 104 operably connected to the beam generating device 102 via a conduit 106 extending between the beam generating device 102 and the cutting head assembly 104.

The system 100 can further include a base 114, a user interface 116 supported by the base 114, and a second actuator 118 configured to move the waterjet assembly 104 relative to the base 114 and other stationary components of the system 100 (e.g., the fluid-pressurizing device, a laser source, or a plasma source 102), or to move the base 114 relative to the cutting head assembly, (such as a stationary waterjet assembly) 104, or to move both. For example, the second actuator 118 can be configured to move the cutting head assembly 104 along a processing path (e.g., cutting path) in two or three dimensions and to tilt cutting head assembly 104 relative to the base 114, or to tilt the base relative to the cutting head assembly 104, or to tilt both. In some embodiments, the second actuator tilts the cutting head assembly 104 in each of two dimensions: a tilt-forward within the cutting plane that is perpendicular to the top surface of the work piece and contains the motion vector, and a lateral tilt rotation within a plane that is perpendicular both to the cutting plane and to the top surface of the workpiece. For example, in some embodiments, the conduit 106 includes a joint 119 (e.g., a swivel joint or another suitable joint having two or more degrees of freedom) configured to facilitate movement of the cutting head assembly 104 relative to the base 114. Thus, the cutting head assembly 104, or the base 114, or both, can be configured to direct a beam toward a workpiece (not shown) supported by the base 114 (e.g., held in a jig supported by the base 114) and to move relative to either the cutting head assembly 104 or the base 114, or both, while directing the jet toward the workpiece. In various embodiments, the system can also be configured to manipulate the workpiece in translatorical and/or rotatorical motion or a combination of both, manipulating the jet and the workpiece.

The user interface 116 can be configured to receive input from a user and to send data based on the input to a controller (124). The input can include, for example, one or more specifications (e.g., coordinates, geometry or dimensions) of the processing path and/or one or more specifications (e.g., material type or thickness) of the workpiece and operating parameters (e.g., for a waterjet tool, pressure, flow rate, abrasive federate; for a plasma tool, electric current; for a laser tool, beam intensity).

The cutting head assembly 104 can include a beam outlet 108 and a control device 110 upstream from the beam outlet 108. For example, the control device 110 can be configured to receive fluid from the fluid-pressurizing device 102 via the conduit 106 at a pressure suitable for waterjet processing or gases and electric current for plasma cutting or a laser beam for laser cutting. The control device can be positioned at a different location between beam generating device 102 and the cutting head assembly 104.

The system 100 can further include a consumable delivery apparatus 120 configured to feed consumables, such as particulate abrasive or process gases, from a consumables storage container 121 to the cutting head assembly 104 or to the beam generating device 102. Within the cutting head assembly the processing beam is generated that in some embodiments can consist of a laser beam possibly surrounded by process gasses, a fluid jet with our without added and accelerated abrasive particles or a gas jet that is transformed into a plasma beam by applying electric current. In some embodiments the consumable delivery apparatus 120 is configured to move with the cutting head 104 relative to the base 114, or vice versa. In other embodiments, the consumable-delivery apparatus 120 can be configured to be stationary while the cutting head assembly 104 moves relative to the base 114. The controller can be configured to vary the demanded power at the beam device or within the system. The system can consist of one or more cutting heads that can be controlled individually and can be applying same or different parameters (orifice size, mixing tube size, abrasive size, abrasive type, abrasive feedrate, etc.). The base 114 can include a diffusing tray 122, such as, among others, one configured to hold a pool of fluid positioned relative to the jig so as to diffuse the remaining energy of the jet from the cutting head assembly 104 after the beam passes through the workpiece. The system 100 can also include a controller 124 (shown schematically) operably connected to the user interface 116, the first actuator 112, and the second actuator 118, in a variety of fashions or steps of hardware. In some embodiments, the controller 124 is also operably connected to an consumable metering device 126 (shown schematically) of the consumable delivery apparatus 120. In other embodiments, the consumable delivery apparatus 120 can be without the metering device 126 or the metering device 126 can be configured for use without being operably associated with the controller 124. The metered consumables can be but are not limited to process gases, electric power, abrasive garnet.

The controller 124 can include a processor 128 and memory 130 and can be programmed with instructions (e.g., non-transitory instructions contained on a computer-readable medium) that, when executed, control operation of the system 100.

The system can be configured to contain one or more independent or connected motion control units. The system can be configured in various ways that allow perpendicular, rotational and/or angular cutting of workpieces of different shape. Embodiments of the system can include but are not limited to gantry, bridge, multi-axis kinematics (similar in function to OMAX Tilt-A-Jet or A-Jet tools), 6-axis robot, rotary, and hexapod style machines. In various embodiments, the system is suited to cutting workpieces of a wide variety of thicknesses, including workpieces of negligible thicknesses.

In various embodiments, the system 100 uses various fluids other than water and can also include gases. In various embodiments, the system 100 is adapted to cut workpieces of a variety of three-dimensional shapes. In some embodiments, the jet can cut at any angle relative to the workpiece.

While some embodiments of the facility are adapted for use in connection with the beam cutters, such as a waterjet system 100, in some embodiments the facility can be used with any motion system, including robots, hexapod, and other tilting mechanisms.

FIGS. 2A-2E are processing diagrams that illustrate the effect of the beam tool, such as a waterjet cutting tool, on the shape of the resulting cutting front and the use of tilting to compensate for them. The cutting front represents the effect of the beam tool on the workpiece at the leading edge of the beam.

FIGS. 2A-2B illustrate compensation for the effect of jetlag on the cutting front. FIG. 2A is a side view processing diagram illustrating the cutting front due to jetlag without tilt-forward compensation. The direction of motion of the cutting head is toward the right side of the diagram. The jet 202 is projected along a jet vector 201 that is perpendicular to the top surface of the workpiece 203. Due to the motion of the cutting head toward the right side of the diagram, the cutting front shape 202 extends toward the left side of the diagram, away from the jet vector. Accordingly, while it would be ideal to have removed all of the material from the workpiece in the cutting path except rectangular section 204, the jet has also failed to remove roughly triangular section 205.

FIG. 2B is a side view processing diagram illustrating the cutting front tool shape behavior with tilt-forward compensation. Here, the tilt-forward feature of the shown waterjet system is used to rotate the jet access 211 toward the direction of travel of the cutting head. As a result, the leading edge of the cutting front 212 is nearly vertical, leaving very little excess material other than rectangular section 214.

FIGS. 2C-2E illustrate the effect of the beam tool on the sides of the cutting front, which is inducing taper and its compensation method, for a straight or arced cut perpendicular into the drawing's plane.

FIG. 2C is a front view processing diagram illustrating the cut edge behavior without lateral shift or lateral tilt compensation. The direction of motion of the cutting head is perpendicular to the plane of the diagram. The jet 222 is projected along a jet vector 221 that is contained by the plane to be cut at the edge of the workpiece 223, which is the left edge of trapezoidal region 225. As the cutting head moves perpendicular to the plane of the diagram, all of the workpiece material that is within the cross-section of the jet 222 is removed, including trapezoidal region 225, which is intended to remain intact as a portion of the cut part.

FIG. 2D is a front view processing diagram illustrating the cut edge behavior with lateral shift compensation, as indicated by the kerf width of the cut edge. It can be seen by comparing FIG. 2D to FIG. 2C that the jet vector 231 has been shifted laterally, away from the part being cut, by an offset distance 237 relative to jet vector 221 shown in FIG. 2C. This offset distance 237 is half of the kerf width—the width of the channel circle cut into the top surface of the workpiece 223 by the jet. As a result, the triangular region 235 errantly removed in FIG. 2D after this lateral shift is smaller than the trapezoidal region 225 errantly removed in FIG. 2C without the lateral shift.

FIG. 2E is a front view processing diagram illustrating the cut edge behavior with lateral shift and lateral tilt compensation as indicated by the taper of the cut edge. It can be seen by comparing FIG. 2E to FIG. 2D that the jet vector 241 has been rotated in plane perpendicular to the cutting head's direction of travel, away from the part being cut, by an angle alpha 246 relative to jet vector 231 shown in FIG. 2D. This angle alpha is derived from the modelled geometry of the remaining workpiece to generate the demanded shape of the edge of the workpiece. In FIG. 2D it is established to be at least approximately equal to the angle at the top of triangular region 235. As a result, the right edge of the jet 242 facing part 244 is in the displayed example roughly vertical, such that little or no material is errantly removed from the part. As the cut edge of the workpiece may not be a straight line, in some embodiments the facility applies cutting optimization criteria to determine the optimal tilt compensation. Such cutting optimization criteria include but are not limited to: minimal maximum deviation, minimal average deviation, minimal deviation at specific cutting depths.

Facility Details

Many conventional approaches to creating a cutting model incorporate predefined algorithms, often including fixed constants, as interpretative correction factors, based on prior experience and fixed data. In such approaches, the cutting model is largely static and is not easily adjustable, particularly by the user of the beam cutting tool, such as a waterjet machining system.

The facility, on the other hand, generates its cutting models from variable pools of cutting test observations; the cutting models derived automatically update, as the input observations are modified, including insertions and deletions. In some embodiments, the facility uses a pool of observations that was pre-populated by one entity like the manufacturer of the machine, but is also open to accepting additional observations from other sources to provide a basis for constructing better models. The additional data sources can be customers/service providers that need to cut a very specific material that has not been included in the original pool of observations, since it may be of limited value to other customers. It can include additional testing that a customer wants to perform to increase the precision of the cutting model in an area that is very sensitive for the customer. The generation of this data table can be performed by this customer, it can be performed as a service by the manufacturer, or by a third party, including groups operating in a cloud environment—and as distributed data sets.

In some embodiments, the facility also allows the manufacturer to provide data sets for specific configurations or materials to a customer as an optional product at additional cost. For example, for a very basic cutting tool, the extent of cutting model could be very limited and the customer can e.g. later obtain, for example, a "Ceramic Cutting Model Package," or can obtain a package for a specific parameter (e.g. nozzle) combination.

The facility also enables third parties to offer data sets as a service. A company may generate a comprehensive data set for a special material. In some embodiments, the facility enables the company to sell the use of this dataset to other companies by providing an environment similar to an internet marketplace, or via other channels.

As greater numbers of observations become available to the facility via the observation repository, the likelihood increases of being able to select observations as the basis for a model that closely mirrors the characteristics of the projects for which the model will be used. This, in turn, enables the facility to rely to a lesser degree on observations that more significantly diverge from the characteristics of the projects for which the model will be used.

In some embodiments, the facility stores additional information about each observation that relates the observation to the tool on which the cutting test that produced the observation was performed, such as an identifier of the tool, and/or detailed characteristics of the tool (i.e., the nature of the tool, its operating parameters, etc.) that may have affected the results of the cutting tests. In some embodiments, the facility creates a model tailored to a particular tool expected to be used for an associated project or projects (the "target tool"), which has its own detailed characteristics. In such cases, the facility selects observations for incorporation into the model based in part about how well the information about detailed characteristics of the tools that were the source of the observations matches the information about detailed characteristics of the target tool. In some embodiments, while the model generated for a particular project is itself not customized for the detailed characteristics of the target tool, the facility generates additional machine commands or tool settings for transforming information produced by the general model into information tailored for the detailed characteristics of the target tool.

In some embodiments, the facility uses its tracking of detailed tool characteristics as described above as a basis for generating models and compiling tool paths across tools that differ to varying degrees, including in some cases tools of the same model that are configured differently; different tool products from the same manufacturer; tools from different manufacturers; etc. That is, in such embodiments, tools that differ in these ways from a target tool may nonetheless be used to perform cutting tests that produce observations that are included in the observation repository used to generate a model for the target tool.

Different sources of cutting test results may have varying reliability or trustworthiness. A user may trust his or her own cutting data more than the data from the manufacturer or from a third party. Accordingly, in some embodiments, the facility uses a weighting factor (e.g., one based on reliability), when merging data from different sources. That means, for example, the data from reliable sources may be preferred over data from less reliable sources if both data sets are available for the given condition. In some embodiments, if only one data set is available at this condition (e.g., for an uncommon material), the facility may use this data set because it is more reliable than extrapolating data from very different conditions. The reliability index for each dataset can be assigned by the user who is using distributed data sets, including changes to the reliability index assigned, based upon later experience or other factors. In some embodiments, the facility derives the weighting factor from a rating system that incorporates experiences from different users, and therefore can change over time. In some embodiments, the reliability index is assigned by data provider or even differently per data provider. In some embodiments, a part of the weighting factor is generated by self-assessment of the data provider. In some embodiments, the facility maintains two or more different kinds of weighting factors for each observation. In various embodiments, these can include one that the source of the observation applies, e.g., for the trustworthiness of the operator that performed the test; one that an operation of an observation service applies to quantify the trustworthiness of the source; and/or one that is based on a rating system by users of the data, similar to rating of vendors and/or products at consumer product retailing websites.

In some embodiments, the facility automatically rates the cutting test observations uploaded based on comparing with previous cutting test observations, and/or facilitates human review and rating, such as to prevent spamming or mistakes among the cutting test observations from corrupting models that would otherwise be based on them. In the case of automatic ratings, the facility assesses cutting test observations previously uploaded by the same user or company to establish trust. The facility then automatically assigns newly-uploaded cutting test observations a trust/reliability attribute based on the past rating for the entity providing the data. In addition, in some embodiments, each cutting test observation has an identifier identifying the entity that submitted it, so that, should future data turn out to be malicious, past data from that submitting entity can be removed or reduced in trust accordingly.

Similar to the approach described above where the dataset is being shared or distributed, in some embodiments, the facility treats an encapsulated copy of a cutting model similarly. The facility generates the functional model from the test data and physical and empirical constraints. Instead of sharing the test data, in some embodiments the facility shares the abstract model in some or all of the ways described in the paragraph above.

In some embodiments, for distributed compilation, the facility encapsulates the cutting model and causes it to be provided to the computer to perform the compilation.

FIG. 3 is a block diagram showing some of the components typically incorporated in at least some of the clients, servers, and other devices on which the facility operates. In various embodiments, these devices 300 can include server computer systems, desktop computer systems, laptop computer systems, netbooks, mobile phones, personal digital assistants, televisions, cameras, automobile computers, electronic media players, computer cards, etc. In various embodiments, the computer systems and devices include zero or more of each of the following: a central processing unit ("CPU") 301 for executing computer programs; a computer memory 302 for storing programs and data while they are being used, including the facility and associated data, an operating system including a kernel, and device drivers; a persistent storage device 303, such as a hard drive or flash drive for persistently storing programs and data; a computer-readable media drive 304, such as a floppy, CD-ROM, or DVD drive, for reading programs and data stored on a computer-readable medium; and a network connection 305 for connecting the computer system to other computer systems to send and/or receive data, such as via the Internet or another network and its networking hardware, such as switches, routers, repeaters, electrical cables and optical fibers, light emitters and receivers, radio transmitters and receivers, and the like. While computer systems configured as described above are typically used to support the operation of the facility, those skilled in the art will appreciate that the facility may be implemented using devices of various types and configurations, and having various components.

Figure 4:
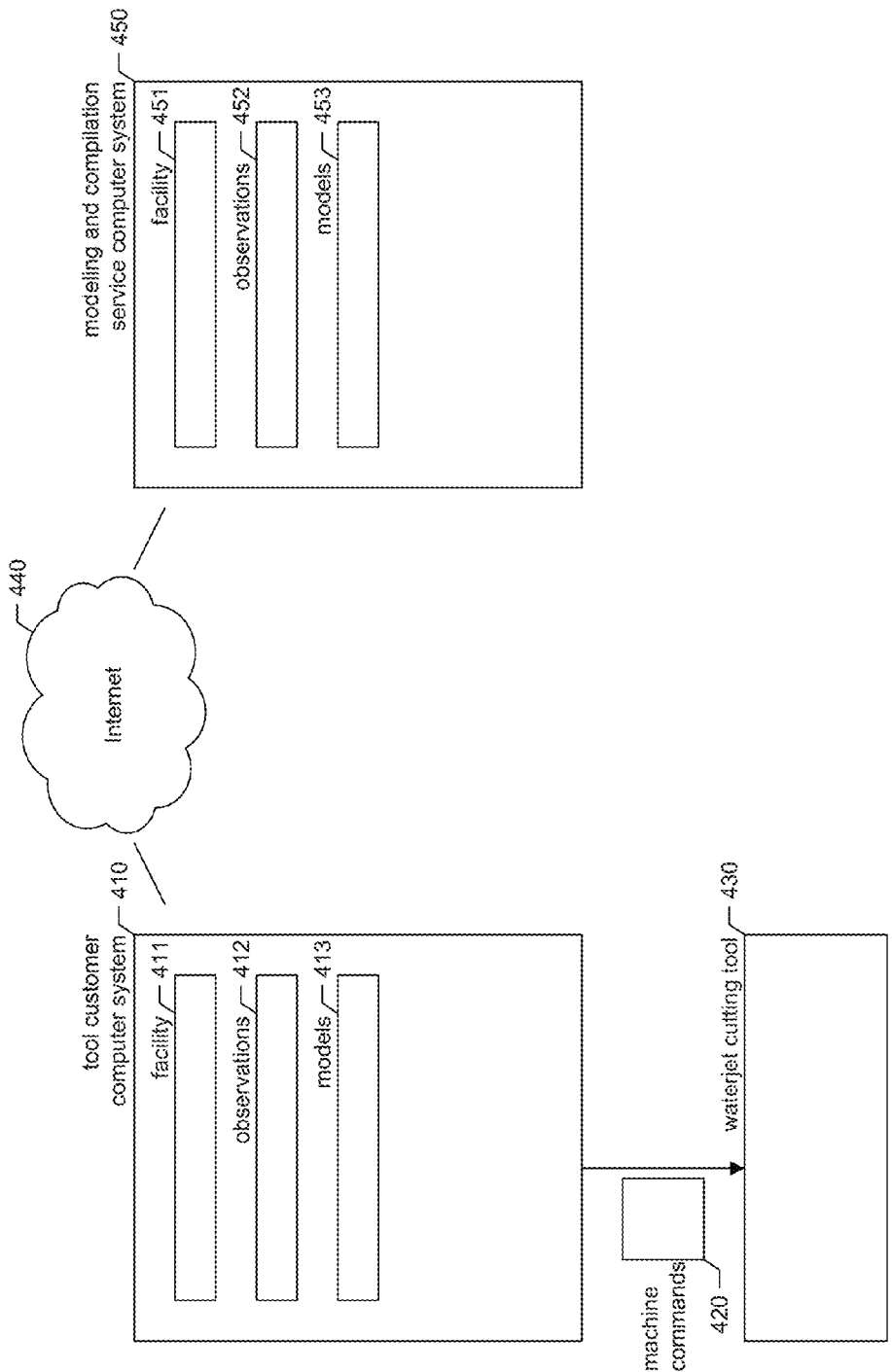
FIG. 4 is a network diagram showing an arrangement of computer systems on which the facility operates in some embodiments.

FIG. 4 is a network diagram showing an arrangement of computer systems on which the facility operates in some embodiments. The diagram shows a tool customer computer system 410 that is operated by, and in some cases owned, by the tool customer that operates a beam cutter, such as the example waterjet machining system 430. In some embodiments, the tool customer computer system is located on the same premises as the tool. Executing on the tool customer computer system is the facility 411 for collecting cutting test observations 412, using them to construct cutting models 413, and applying those cutting models to determine, for each cutting project, a tool path, and corresponding tool commands 420. The tool customer computer system passes the tool commands, via various possible configurations of hardware and/or software, to the tool for execution to perform the cutting project.

In some embodiments, various portions of the functionality are completely offloaded to or assisted by a modeling and compilation service computer system 450 via the Internet 440. In some embodiments, the modeling and compilation service computer system is operated by the manufacturer of the tool. For example, in some embodiments, the observations 412 used by the facility on the tool customer computer system to generate cutting models 413 are managed by the modeling and compilation service computer system and published to the tool customer computer systems of one to multiple tool customers. In some such cases, observations managed by the modeling and compilation service computer system are contributed by a variety of different tool customers, and/or other third parties. In some embodiments, the observations used by the facility on the tool customer computer system to construct a particular cutting model are selected for the project and returned by the modeling and compilation service computer system. In some embodiments, the modeling and compilation service computer system itself constructs and/or caches models needed by the tool customer computer systems, and/or tool paths and/or machine commands that are based on such models.

Figure 5:
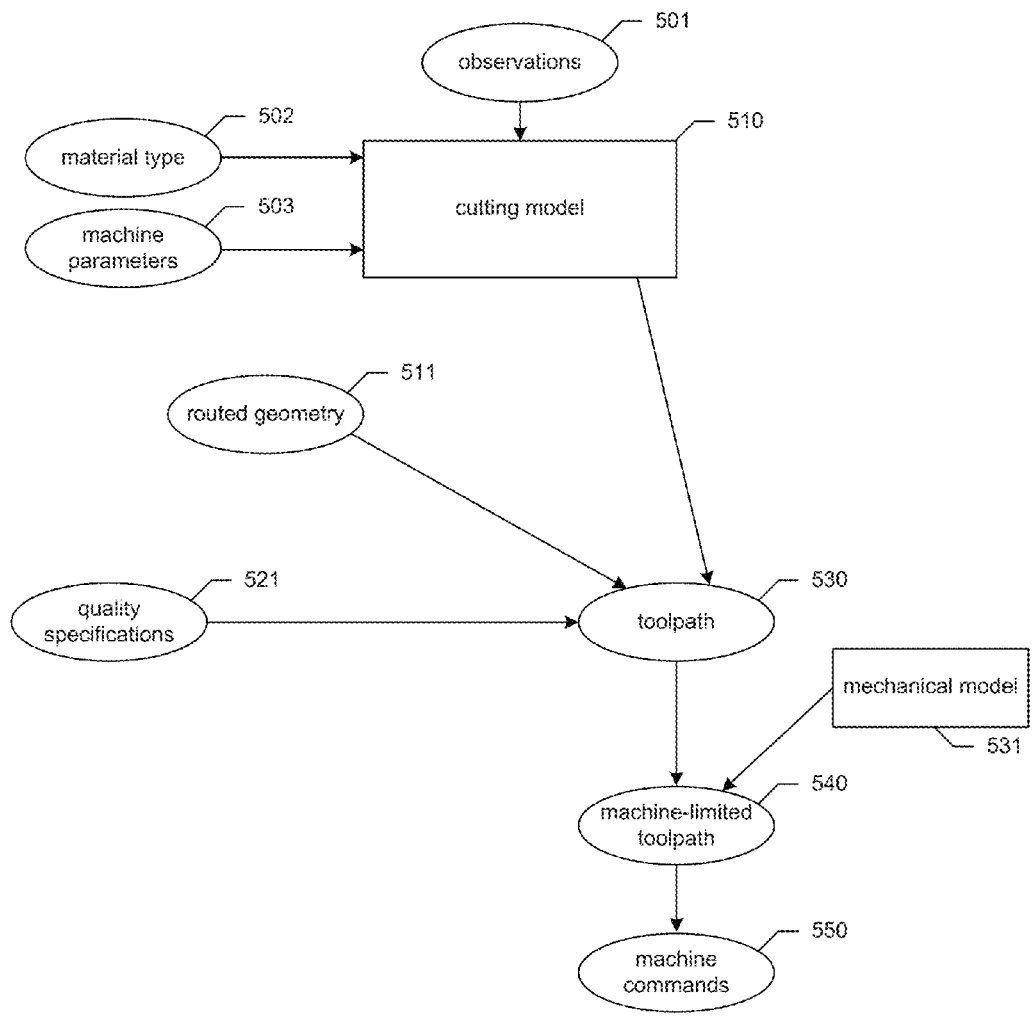
FIG. 5 is a data flow diagram showing data flows produced by the facility in some embodiments.

FIG. 5 is a data flow diagram showing data flows produced by the facility in some embodiments. The diagram shows observations 501. These contain the results of cutting tests performed with a beam cutting tool, such as the exemplary waterjet cutting machines. In some embodiments, the observations reflect the results of cutting tests to determine (for example): separation speed, jetlag, kerf width, and taper. Each of the cutting tests is performed based upon material of a particular type, and a number of machine operating parameter values, such as, for the example, orifice diameter, mixing tube diameter and length, pressure, abrasive type and feed rate, material type, class and thickness, cutting head design, etc.

A separation speed cutting test measures the separation speed under those particular conditions. A separation speed cutting test is in some embodiments performed by conducting a number of different cuts in the workpiece at different speeds, and identifying, among the cuts achieving full separation, the one performed at the highest speed. Thus, a single separation speed cutting test with a single workpiece typically produces a single separation speed. In various embodiments, the recorded observations also may include the results of piercing tests, etching tests, milling tests or still others.

A jetlag cutting test measures jetlag. A jetlag cutting test is in some embodiments performed by making cuts in a workpiece at different speeds; in each cut, the jet is switched off abruptly while the cutting head continues to move. The jetlag is determined by measuring the distance at one or more cutting depth. Another approach is to analyze the patterns at cut edge surface or derive the jetlag from measuring the geometry of an arced cut. In various embodiments, various other approaches are used to perform a jetlag cutting test.

A kerf width cutting test measures the kerf width at the entry point of the cut for a given cutting speed.

A taper cutting test measures taper error. Taper is defined as deviation from the top measured kerf width. A taper cutting test is in some embodiments performed by making straight or arced cuts in a workpiece at different speeds. In each cut, the taper distance is measured at each of one or more depths by determining the distance perpendicular to the direction of travel from the extent of the cut on the top surface of the workpiece to the extent of the cut at the depth being measured. Thus, a single taper cutting test can produce a number of different taper errors, each corresponding to a different combination of speed and depth.

In various embodiments, the facility receives, adds to its observation repository, and incorporates into models cutting tests that vary in certain respects, such as cutting tests that involve cutting in shapes other than straight lines, and/or cutting tests that involve cutting at tilt-forward and/or lateral tilt angles other than vertical.

In order to collect the observations contained in the repository 501, the number of cutting tests of each of the different types is performed with different materials and various values of different machine operating parameters. In some embodiments, all of the cutting tests are performed by the manufacturer of the tool. In some embodiments, the cutting tests are performed by a variety of parties in possession of tools, including the manufacturer, customers, other third parties, etc. In some embodiments, the observations 501 can be collected over time, as is discussed in greater detail below in connection with FIG. 6.

When a tool path is to be generated for a particular project, the facility determines whether a cutting model appropriate for the project already exists based upon the material type and machine operating parameters specified for the project. If such a cutting model does not already exist, the facility constructs an appropriate model, as is discussed in greater detail below in connection with FIG. 9.

For the project, the facility further generates a general model of different possible geometries 520, that specifies the cut edge of the specific geometric element, (corners, radii, angles), up to the maximum thickness possible for the material specified and for the given or possible operating parameters.

In an alternate embodiment, the outcomes calculated for the possible library of changes in geometric elements' shape and thickness may be reduced by providing the actual geometric shape and thickness of the target workpiece. If not already done in the step above, the facility then obtains for the target workpiece the routed geometry that contains the specific geometric elements 511, cutting depth and quality specifications 521 to generate/assemble a tool path 530 specifying a speed at which the cutting head is to travel during each segment of the routed geometry. The quality specification specifies, for each segment of the routed geometry, a level of quality to be imposed on the cut edge: that is, for example, the degree of roughness of the cut edge; edge taper desired; etc. The facility uses this information in order to generate a tool path, as is discussed in greater detail below. In some embodiments, the generated tool path includes compensation for the radius of the jet, such as by incorporating an offset equal to the jet radius in the kerf width measure used in the tool path.

To the tool path 530, the facility applies a mechanical model 531 specifying the operational limits of the tool to obtain a machine-limited tool path 540 that specifies speeds for each segment of the geometry that are within the capabilities of the tool. Some of the operational limits include maximum machine speed, maximum machine acceleration, permissible machine limits for each axis, etc. The facility then transforms the machine-limited tool path into machine commands 550 suitable for execution by the tool in order to perform the project.

Figure 6:
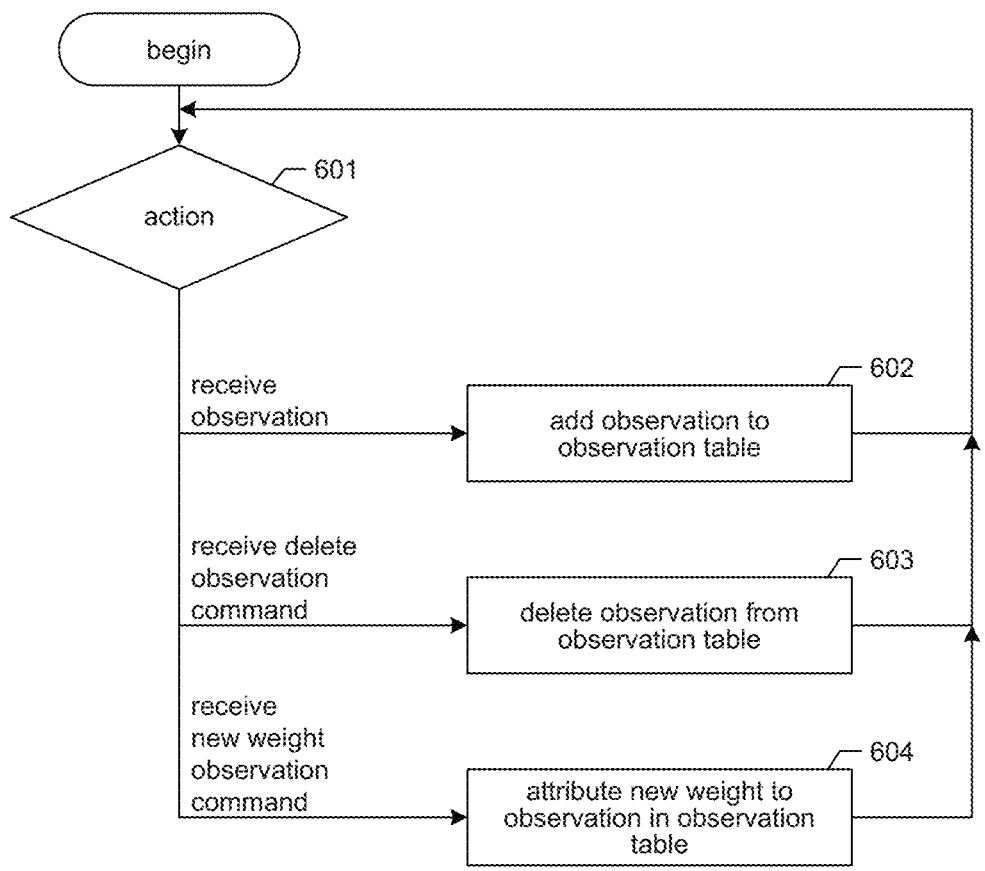
FIG. 6 is a flow diagram showing steps typically performed by the facility, in some embodiments, in order to manage a repository of observations for use in generating cutting models. In step 601, an action occurs with respect to the repository.

FIG. 6 is a flow diagram showing steps typically performed by the facility in order to update and organize an evolving repository of observations for use in generating cutting models. In step 601, an action occurs with respect to the repository. If the action is to receive a new observation, then the facility continues in step 602 to add the observation to an observation table that embodies the observation repository in some embodiments. Additional details about the observation table are discussed in connection with FIG. 7 below. After step 602, the facility continues in step 601 to process the next action with respect to the repository. If the action is to receive a command to delete a particular observation from the repository, then the facility continues in step 603 to delete the specified observation from the observation table. After step 603, the facility continues in step 601 to process the next action with respect to the repository. If the action is to receive a command to attribute in the weight to a particular observation in the repository, then the facility continues in step 604 to change a weight associated with the observation in the observation table that specifies the degree to which the observation to be incorporated into cutting models for which it is otherwise appropriate. In various embodiments, the facility supports a variety of other actions for organizing and editing its observations repository. In some embodiments, the facility permits a user to designate observations that will be available for use in generating a model. In some such embodiments, the facility permits such a user to control which observations are included in versus excluded from the observation repository. In other such embodiments, the facility permits such a user to set a flag or other indication maintained in the observation repository for each observation that specifies whether the observation will be available for use in generating models and on the basis of any designated weight or bias.

Those skilled in the art will appreciate that the steps shown in FIG. 6 and in each of the flow diagrams discussed below may be altered in a variety of ways. For example, the order of the steps may be rearranged; some steps may be performed in parallel; shown steps may be omitted, or other steps may be included; a shown step may divided into sub-steps, or multiple shown steps may be combined into a single step, etc.

FIG. 7 is a table diagram showing example contents of an observation table used by the facility in some embodiments to store information about observations contained in the facility's observation repository. The observation table 700 is made up of rows, such as rows 701-714, each corresponding to a single observation contained by the observation repository. Each row is divided into the following columns: an ID column 721 containing an identifier that can be used to refer to the observation, such as a unique identifier; a timestamp column 722 containing an indication of the time at which the observation was most recently added to or updated in the observation table; a source column 723 identifying the provider of the observation, such as the entity who performed the cutting test that yielded the observation, or an intermediary through which the information was obtained; a material or material type column 724 naming the material that was the subject of the cutting test; a material index column 725 containing a material index indicating the relative susceptibility of the material to beam tool cutting, such as cutting by a waterjet machining system; a group of operating parameters columns 726 (contents not shown for brevity) that identifies values for tool operating parameters used in the cutting test (such as pressure, abasive flowrate, radius of cut, etc.); a test type column 727 indicating which type of cutting test was performed; a depth parameter column 728 indicating, for separation speed tests, the thickness of the material that was separated, and for jetlag and taper tests, the depth in the material at which measurements were performed; a speed parameter column 729 indicating, for jet lag and taper tests, the cutting speed at which the measured results were obtained; and a measurement column 730 reflecting, for separation speed tests, and measurement of the separation speed, and for jetlag and taper tests, the jetlag or taper distance measured. For example, row 703 indicates that the observation having identifier 46798 was last added or updated on Jan. 11, 2015 at 6:22:01 PM; was received from customer A; involved cutting the material polycarbonate having a material index of 517; was performed using a tool having a variety of operating parameter values not shown for brevity; was a measurement obtained from a jetlag cutting test at a depth of 2.0 mm and a speed of 2.0 mm/s; and yielded a jetlag measurement of 0.41 mm.

While the sample contents of the observation table show only materials of the type polycarbonate having a material index 517, those skilled in the art will appreciate that, in many embodiments, the observation table will contain observations for a wide variety of materials having different material indices. In addition to material type and index, in some embodiments, the observation table also includes a material class such as metal, stone, or plastic used to characterize together groups of materials with similar cutting properties. In some embodiments, the observation table also includes further details about the material that was the subject of the cutting test, such as (a) a particular alloy or other recipe or method used in making the material, and/or (b) manufacturing or treatment techniques used in the production of the material and/or (c) specific properties of the material such as for example hardness or yield strength. In various embodiments, when constructing a model for a particular material, the facility uses various combinations of this information about the material that was the subject of the cutting tests corresponding to the observations in the observation table to determine their level of similarity to the modeled materials as a basis for selecting observations for use in constructing the model.

The diagram also shows a last update time field 740 for the entire table, showing the last time at which any contents of the table were changed, such as by adding, changing, or deleting a row. In some embodiments, even where a cutting model appropriate to a project already exists, the facility nonetheless creates a new cutting model if the existing cutting model was created prior to the last update time for the observation table, to ensure that new and changed observations are reflected in any cutting model used. In some embodiments, the creation of a new cutting model in such circumstances is at the discretion and option of the operator.

While FIG. 7 and each of the table diagrams discussed below show a table whose contents and organization are designed to make them more comprehensible by a human reader, those skilled in the art will appreciate that actual data structures used by the facility to store this information may differ from the table shown, in that they, for example, may be organized in a different manner; may contain more or less information than shown; may be compressed and/or encrypted; may be distributed across several tables or data structures of other types, etc.

Figure 8:
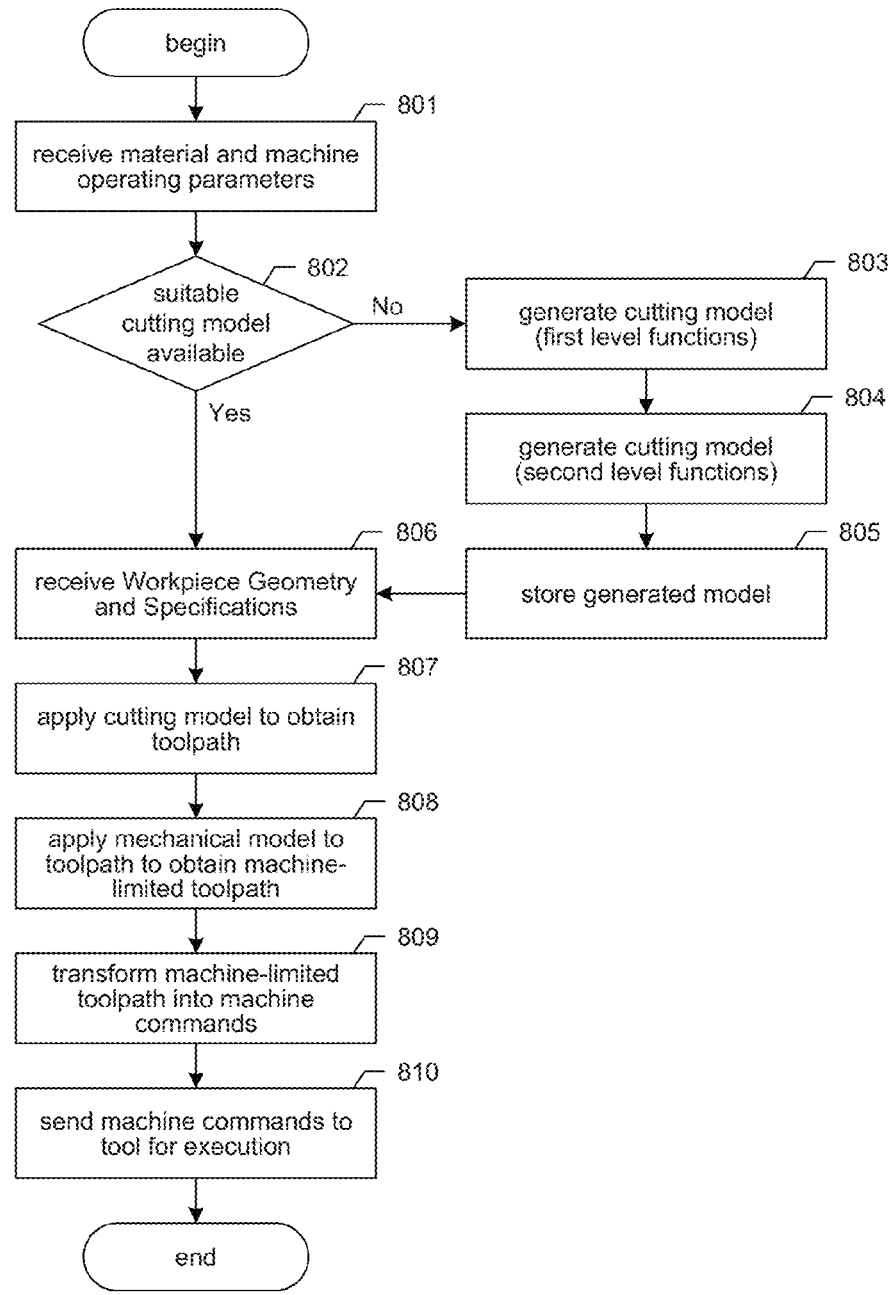
FIG. 8 is a flow diagram showing steps typically performed by the facility, in some embodiments, in order to generate a stream of machine commands and control signals for a cutting project.

FIG. 8 is a flow diagram showing steps typically performed by the facility in some embodiments in order to generate a stream of machine commands and control signals for a cutting project. In step 801, the facility receives material and machine operating parameters for the project. In step 802, if a suitable cutting model is available for use in the project—that is, a model exists that was generated for material and machine operating parameters that are similar enough to those received in step 801—then the facility continues in step 806 to use an existing cutting model, else the facility continues in step 803 to generate the first level modeling functions for a new cutting model for the project. The first level functions can describe the geometric properties, as outcomes from the machining operation on the workpiece (e.g., separation speed, jet lag, taper, kerf width), as resultant aspects. In various embodiments, the facility uses observation tables, either in their entirety or parts thereof, a separate observation table, or another mechanism, to verify the validity of the first level functions and/or to adjust the first level functions accordingly. Additional details about step 803 are discussed below in connection with FIGS. 9 and 10.

The second level function in step 804 describe the expected geometrical shape of the cutting front and the resulting cut edge at any of a multiplicity of geometrically different cutting entities. The relevant parameters for the second level function can include but are not limited to curvature, direction, tilting angle as well as changes in those geometrical properties along the cutting entities. In some embodiments the full possible extent of relevant geometrical parameters is included in those second level functions. In other embodiments a subset of reasonable ranges based on the specifications of the current cutting project or other criteria can be selected. Additional details about step 804 are discussed below in connection with FIGS. 9 and 10.

In step 805, the facility stores the generated cutting model in a cutting model repository embodied by the cutting model table. Additional details about step 805 are discussed below in connection with FIG. 11.

In step 806, the specific geometry of the cutting project and its specifications are received. In step 807, the facility applies the cutting model generated in step 804 or the existing suitable cutting model identified in step 803 to the actual geometry and specification of the routed geometry for the cutting project in order to obtain a tool path. Additional details about that 807 are discussed below in FIG. 9. In step 808, the facility applies a mechanical model specifying the mechanical limits of the tool to the tool path obtained in step 807 to obtain a machine-limited tool path. In some embodiments, the facility generates this machine-limited tool path in an earlier step. In step 809, the facility transforms the machine-limited tool path into machine commands executable by the tool. In step 810, the facility sends the machine commands to the tool for execution. After step 810, these steps conclude.

Figure 9:
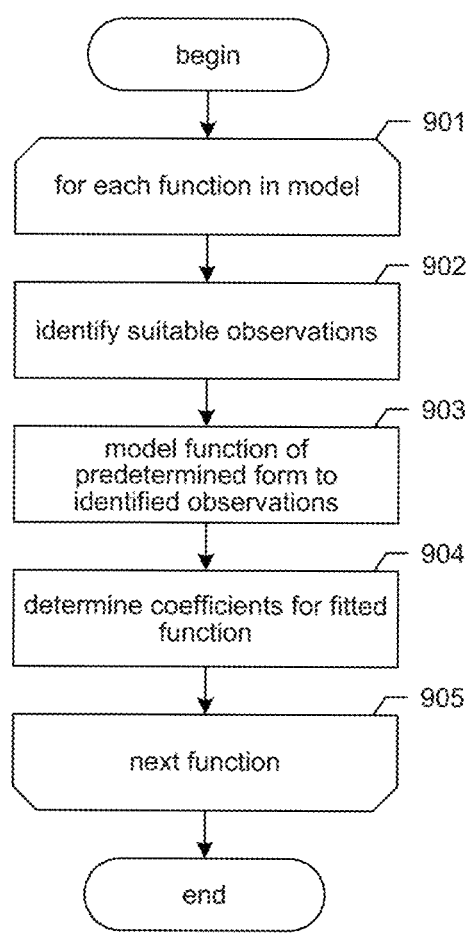
FIG. 9 is a flow diagram showing steps typically performed by the facility, in some embodiments, in order to generate a new cutting model.

FIG. 9 is a flow diagram showing steps typically performed by the facility in order to generate a new cutting model. In steps 901-905, the facility loops through each dependent variable modeled by the facility, also called a "modeled aspect" of the beam tool's effect on the workpiece. In some embodiments, these include, for example, separation speed, jetlag, kerf width, and taper. In step 902, the facility identifies observations in the observation table that are suitable for the model. In some embodiments, this involves selecting observations for tests of the corresponding test type. In some embodiments, this involves selecting observations from tests performed using a material that is either the same as or similar to the material specified for the model, and/or a material having a similar material index. In some embodiments, this involves selecting observations from tests performed using the same or similar values of tool operating parameters as those specified for the model.

Figure 10:
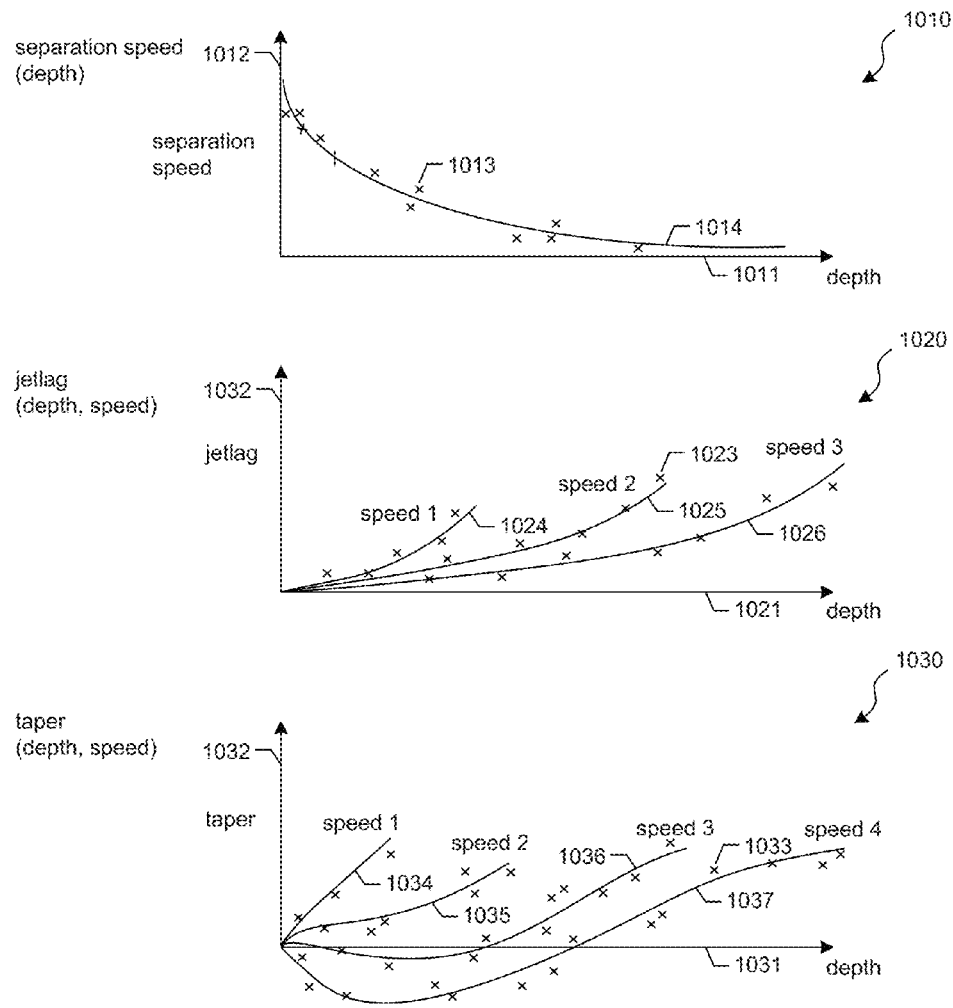
FIG. 10 is a statistical graph diagram showing the derivation of curves from observations selected by the facility, in some embodiments, for each curve.

From the first level function(s) calculated by the facility for the material and beam operating parameters for certain of the modeled aspects, the facility determines second level functional relationships of other modeled aspects for a library of possible radii, speeds, and cornering strategies, either stored as new second level derivative functions, or alternatively as look up tables/matrices of the resulting calculations. In various embodiments, the facility uses the utilized observation table in its entirety or a part thereof, a separate observation table, or another mechanism to verify the validity of the second level functions and/or to adjust the second level functions accordingly. At this point, the user can develop a tool path for any geometry and any thickness and any other independent variable, for the material selected and the waterjet equipment operating parameters being employed. The remaining workpiece parameters—thickness; geometry and quality objectives—can now be provided, if not already done so, and the facility rapidly constructs an appropriate tool path using the pre-calculated functions and/or lookup tables. In step 903, the facility models a function of predetermined form to the observations identified in step 902. In FIG. 10, it can be seen that the facility has modeled function 1014 to the selected separation speed observations for the aspect of separation speed. In some embodiments, the facility performs this modeling starting with a parametric equation determined by the inventors to generally represent the relationship between the modeled quantities over a wide range of values.

FIG. 10 is a statistical graph diagram showing the modeling of predetermined parametric functions for modeled dependent variables ("modeled aspects" or "aspects") to observations selected by the facility for each dependent variable. For example, graph 1010, corresponding to the speed function, in which the X axis 1011 is depth and the Y axis 1012 is separation speed, shows points corresponding to the observations selected for the separation speed function by the facility as points, such as point 1013.

In some embodiments, these predetermined parametric equations are as follows:

speed: $y = ax + bx^{-1} + c$ jetlag: $y = ax^2 + bx + c$ taper: $y = ax^3 + bx^2 + cx + d$ kerf width: $y = az^2 + bz + c$ Returning to FIG. 9, the facility proceeds in step 904 to determine values for the coefficients a, b, c, and d that cause the resulting function of the independent variables x and z, which could be cutting depth, cutting speed or others to most accurately represent the selected observations using least square of error, minimum deviation or other measures. For the separation speed function, the coefficients selected by the facility result in function 1014. This curve, represented by the speed equation with the determined coefficients included, can be used to reliably predict, for a wide range of depths, including those for which no experimental data is available or for which the available experimental data is somewhat aberrant, what the cutting performance—and therefore the separation speed—will be for the material and operating parameters specified for the project.

After step 904, the facility continues in step 905. In step 905, if additional functions remain to be processed, then the facility continues in step 901 to process the next function, else these steps conclude. Graphs 1020 and 1030 in FIG. 10 show derivation of functions for the jetlag and taper functions, respectively. In particular, graph 1020 shows that the facility actually fits a different jetlag function for each of multiple cutting speeds, speeds 1-3. As shown here, speed 1 is the highest speed, speed 2 is the second high-speed, and speed 3 is the third highest speed. Similarly, graph 1030 shows that the facility fits a different taper function to each of multiple cutting speeds, speeds 1-4. Again, here, speed 1 is the highest speed, but one skilled in the art will understand that the scale highest to lowest can be reversed or otherwise altered.

In various embodiments, the modeling functions are dependent on one or more of cutting depth, cutting speed, and tool operating parameters like pressure, abrasive feedrate, or others. In some embodiments, the selection of the modeling function is based at least in part on preexisting know-how.

As discussed below in connection with FIG. 11, a functional model constructed by the facility can be represented simply by the coefficients selected by the facility for the modeling function for each aspect. Such a model can be quickly and inexpensively transmitted and stored. Such a functional model can also be efficiently evaluated for any geometry or material thickness. Further, such a functional model tends to be stable; that is, it tends not to experience any significant discontinuities.

FIG. 11 is a table diagram showing sample contents of a cutting model table used by the facility in some embodiments to store cutting models generated by the facility for future reuse. The cutting model table 1100 is made up of rows, such as rows 1101-1112, each corresponding to a single one of the three functions making up a cutting model stored in the facility's cutting model repository. Each row is divided into the following columns: a model identifier column 1121 identifying the cutting model to which the row corresponds; a timestamp column 1122 containing an indication of the time at which the model was added to cutting model table; a material type column 1123 naming the material that was the subject of the cutting test; a material index column 1124 containing a material index indicating the relative susceptibility of the material to cutting, such as cutting by a waterjet tool; a group of operating parameters columns 1125 (contents not shown for brevity) that identifies values for tool operating parameters for which the model was created; a function column 1126 indicating which function of the model the row represents; a speed parameter column 1127 indicating, for jetlag and taper functions, the cutting speed parameter value to whose function the row corresponds; and coefficients columns 1128-1131 containing the coefficients determined by the facility to define the function. In some embodiments, data from the utilized observation table in its entirety or a part thereof, a separate observation table, or another mechanism to verify the validity of the aspect described by the coefficients of the function or to adjust the coefficients.

For example, row 1102 indicates that the model having identifier 5646 was added on Jan. 9, 2015 at 8:01:06 PM; was generated for the material polycarbonate having a material index of 517; was generated for a tool having a variety of operating parameter values not shown for brevity; is a jetlag function for the model; has the speed parameter value of 2.0 mm/s; and has the exemplary coefficients $a=4.12$, $b=3.11$, and $c=-0.34$.

The cutting path consists of a sequence of segments, each of which can have constant or varying geometrical properties (e.g., angle, direction, cutting depth, and curvature) along its extent, which can range from magnitudes of single motor steps to long rule based entities. For each segment, the facility determines a maximum cutting speed that satisfies the segment's specific constraints regarding surface finish, tolerances, etc. The facility uses the descriptive first and second level modeling functions (jetlag, taper, separation speed, etc.) and the geometry of the cutting path (curvature, cutting angles, cutting depth, etc.) for the modeled aspects to determine the expected cut edge geometry and optimize the operating parameters using geometrical mathematical approaches (known from calculus, vector algebra etc.) so that the specific requirements are met.

For example, if the taper of the cut edge can be described as $y=ax^3+bx^2+cx+d$, the facility determines that the maximum or minimum deviation should be expected at a cutting depth x of $dy/dx=ax^2+bx+c=0$, at $x=(sqrt(b2-4ac)-b)/2a$, or $x=(sqrt(b2-4ac)+b)/2a$. To decide whether it is a maximum or minimum, the facility considers the second derivative. If this is positive at this extreme point, it would be a minimum; negative would indicate a maximum. The minimum value of x at this condition is zero, and the maximum value of x is maximum possible or the actual cutting depth. If the absolute maximum is not within the actual cutting depth, the facility determines whether the local maximum occurs at the boundary conditions (zero cutting depth or maximum cutting depth).

Depending on the configuration of the machine and the cutting project, the facility can perform the optimization by varying the cutting speed alone, or by also modifying the tilting angles relative to the nominal jet vector. In some embodiments, the facility derives both of the tilting angles from the cutting model functions and/or the functional description of the expected non-tilting cut edge geometry. The facility optimizes operating parameters until the required constraints (tolerances, surface finish, etc.) are met, and also including other possible identified constraints, such as part production time, part cost, equipment utilization, etc.

In various embodiments, the facility constructs and applies models that vary in a variety of ways from those described above, including, in some cases: (a) those that vary in the degree to which they are targeted at a particular material type; (b) the degree to which they are targeted to particular tool operation parameters; (c) the degree to which they are targeted to particular physical configurations of the tool, such as particular nozzles, cutting heads, etc.; (d) the degree to which they are targeted to particular processing applications, such as, for waterjet cutting, waterjet piercing, waterjet etching, or other machining processes that can be performed by a waterjet machining system; and (e) the degree to which they are targeted to other economic or non-economic objectives, such as part cost and/or equipment utilization and/or beam tool maintenance objectives.

In some embodiments the cutting model repository contains information about at least some of the projects each stored model was used on; in some embodiments, the cutting model repository is stored within a project control data structure.

Figure 12:
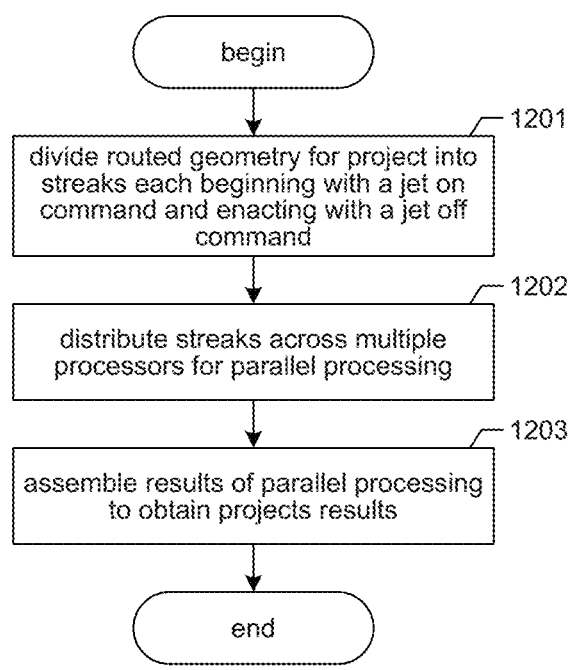
FIG. 12 is a flow diagram showing steps typically performed by the facility in some embodiments in order to take advantage of parallel processing resources.

FIG. 12 is a flow diagram showing steps typically performed by the facility in some embodiments in order to take advantage of parallel processing resources. In step 1201, the facility can divide the routed geometry for this project into two or more "streaks". Those each contain a sensible portion of the routed geometry. Sensible streaks can contain portions of similar length. Typically the division between streaks occurs at a point where the tool is traversing and therefore the jet, for example in abrasive waterjet cutting, is turned off. The smallest typical 'streak' would therefore begin with a tool-on command; end with a tool-off command and machining/cutting operations in between. In some embodiments streaks can be defined to split a project on a cutting entity for example to be able to account for possible changes. By separating the full cutting path, which can be fairly long into smaller streaks, one can separate and parallelize the compilation of those streaks, e.g., on different processors or different computers. With this approach parallel computing is possible, which can save large amounts of time that could otherwise delay the start of the actual cutting process and/or use valuable machine time. In step 1202, the facility distributes the streaks determined in step 1201 across multiple processors for parallel processing. In a variety of embodiments, these could be multiple processors or processing cores all within a single computing device; processors or processing cores installed in multiple computing devices in the same location; processors or processing cores installed in multiple computing devices in multiple locations; virtual machines; cloud-based resources; etc. In step 1203, the facility assembles the results of the parallel processing performance the 1202 to obtain a monolithic result for the project. After step 1203, these steps conclude.

In the compilation process, the facility generates the commands and signals that are necessary to perform the motion on the machine. Inputs to this process are the specific cutting model based on parameters and material properties, the geometry of the expected part, the tool path, the definition of quality and other constraints (e.g. tolerances), that are specified to achieve the desired outcome.

While in some embodiments the facility parallelizes the compilation process on the same computer that is controlling the cutting tool, in some embodiments the facility performs the compilation on different computers within a network or distributed at different locations in a setup similar to a computer cloud. In various embodiments, the facility applies this decentralized compilation to a segmented cutting path or the cutting path as a whole. In some embodiments, the decentralized computer segments the cutting path.

In some embodiments, the facility offers this compilation as a service to customers to offload their machine computers. With this approach, the performance of the machine control computer can be geared towards only managing cutting files, and need not be able to itself compile.

In some embodiments, the compilation service provider guarantees that the compilation is always performed with the latest and best possible software. This eliminates the danger of the customer using outdated versions of the software for compilation.

In some embodiments, the compilation service provider performs the compilation with a particular set of features that the customer had purchased. In some embodiments, the cost of the compilation service is based on a cost per cutting length, per cost savings (less abrasive, less time), per compilation time or other methods.

In some embodiments, the machine is sold with a certain set of features that can be compiled locally. To obtain advanced cutting results, a service is consulted at additional cost (or not) to obtain better/faster cutting results. These can contain but are not limited to features like corner passing, cornering strategies or advanced cutting models.

In some embodiments, the facility creates machine commands for any type of cutting machine from any manufacturer for which the necessary format and the specific kinematics can be determined. Thus, the service may be extended to serve any type/brand of machine and methodology or characteristics of various types of beam cutting.

In some embodiments, the facility compiles at least a portion of the tool path for a project at a time when the machine is already cutting. In some embodiments, the facility performs this just-in-time compilation on a streak-by-streak basis, where the first (few) cutting streaks are pre-computed so that the machine can start cutting. While the machine is cutting, the facility compiles subsequent cutting streaks of the tool path. This can save significant downtime of the machine where it would not be cutting.

In some embodiments, the compilation process can be re-executed during cutting. The processing speed with which the cutting model can be applied, enables the facility to adjust speed, taper, and kerf width while cutting. In such embodiments, the facility works ahead far enough to allow for acceleration/deceleration of the cutting head. In such embodiments, the facility performs tool path compilation for the next phase of the project based on the intra-project cutting test results, such as by generating a new model reflecting such cutting test results, or by using an appropriate correction transformation on information produced by the original model. In some embodiments, such as in cases in which the workpiece is made of expensive material and/or the project geometry does not provide adequate waste space for intra-project cutting tests, the facility directs the intra-project cutting tests to be performed in a secondary sacrificial workpiece mounted in the machine, such as one made of an inexpensive proxy material whose level of susceptibility to the cutting test being performed relative to that of the workpiece material is known. In some embodiments, the facility responds to intra-project cutting test results or other sensed conditions (e.g., for beam cutting, such as with a waterjet machining system, flow rate, catcher tank water temperature, workpiece positioning) by causing the tool to be reconfigured mid-project, such as by increasing the pressure by 5%, instructing an operator to replace the tool's mixing tube, etc.

In some embodiments, even where the facility does all tool path compilation for a project in advance of cutting, the facility uses predicted changes to operating conditions during the course of the project to adjust how modeling and/or compilation are performed for the project. For example, in such a scenario, in some embodiments the facility uses either the progressive model approach described above or the correction transformation approach described above to adapt to the predicted changes to operating conditions during the project.

The success of a business running a beam cutting based tool, (such as a waterjet) strongly depends on choosing the right operating conditions. With intelligent choices of the parameter settings, the tool customer can reduce operating cost, increase reliability, reduce maintenance, and/or increase performance. In some embodiments, the range of variables extends to stacking material, using multiple nozzles, multiple machines, and other factors.

At a time of high utilization of the tool, the tool customer may want to increase performance, at times of low utilization, the tool customer may want to reduce maintenance and operation costs. Currently it is very laborious to obtain precise information to make the right decision in every business situation. In some embodiments, a parameter advisory function of the facility automatically proposes or automatically selects parameters that optimize the operation with respect to the specified criteria.

When using the advisory function of the facility, the tool customer can specify its business situation, as a part of the parameter settings. The business situation may include (or not) accounting methods to determine fixed and variable costs of abrasive waterjet operation and methods to determine expected utilization and opportunity cost. In order to be able to determine the optimal settings, the user provides any available amount of such information, such as in the form of a 2D graphical input or in the form of numerical weights or graphical sliders.

The business situation serves as input to the advisory function, which then optimizes the settings for the given situation. Examples for optimizing parameters are, when the beam cutting technology employed is a waterjet tool:

TABLE 1

Effect on cost per part

| parameter | cost implication of low parameter value | cost implication of high parameter value |
| --- | --- | --- |
| Abrasive feedrate | Low operational cost | High operational cost |
| Pressure | Low maintenance cost | High maintenance cost |
| Multiple nozzles | Low setup cost as result of easier setup/programming | Setup expensive or impossible |

TABLE 2

Effect on cutting performance

| parameter | performance implication of low parameter value | performance implication of high parameter value |
| --- | --- | --- |
| Abrasive feedrate | Low performance | High performance |
| power | Low performance | High performance |
| Multiple nozzles | Low performance with thin material due to machine speed limits | High performance |

All parameters are limited in their range either by physical limits (e.g. for abrasive-jet cutting under 20 ksi is not viable; or perhaps over 60 ksi is not supported by the pump) or by the machine (e.g. only one physical nozzle would not allow choosing multiples). The calculation of each is complex and depends on the part that is being cut and also on the number of parts that are necessary (applying two parallel nozzles or stacking material may not be reasonable if only one part is needed)

In various embodiments, the advisory function works in different phases. The more precise information used, the better the outcome will generally be. As the complexity of calculation increases, more time and/or processing the resources are spent to generate the necessary data. In some embodiments, the faster advisory functions are used for a first estimate, and to filter out certain settings that would not yield promising results.

Figure 13:
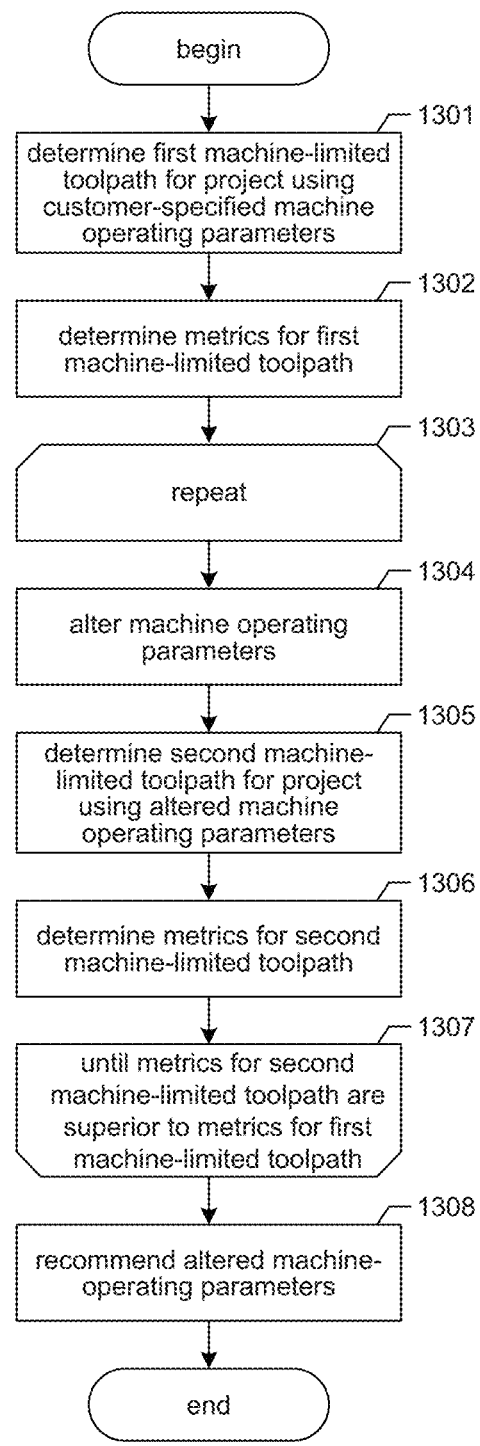
FIG. 13 is a flow diagram showing steps typically performed by the facility in some embodiments in order to propose machine-operated parameters for project that are likely to improve on the result obtained.

FIG. 13 is a flow diagram showing steps typically performed by the facility in some embodiments in order to propose machine operating parameters for cutting or machining a target workpiece on a waterjet that are likely to improve on the result obtained given the workpiece and/or other operational objectives of the end user. In 1301, the facility determines a first machine-limited tool path for a project using customer-specified machine operating parameters. In step 1302, the facility determines metrics for the first machine-limited tool path determined in step 1301. In a variety of embodiments, these metrics can include such metrics as total processing time for the project; resources expended for the project such as water, abrasive, and electricity; cutting quality of some or all segments of the path; maximum or overall deviation of cut part shape from routed geometry; and other metrics. The facility then repeats step 1303-1307 until the test specified in step 1307 is satisfied. In step 1304, the facility proposes alteration of one or more of the machine operating parameters. In step 1305, the facility determines a second machine-limited tool path for the project using the machine operating parameters as altered in step 1304. In step 1306, the facility determines metrics for the second machine-limited tool path determined most recently in step 1305. In step 1307, if the metrics for the second machine-limited tool path are superior to the metrics for the first machine-limited tool path, then the facility continues in step 1308, else the facility continues in step 1303 to propose further alteration to the machine operating parameters. In step 1308, the facility recommends the altered machine-operating parameters to the tool customer, such as by automatically adjusting one or more parameters on the machine, causing them to be displayed on a display device of the tool customer, sending an email or text message to a particular user associated with the tool customer, etc. or an accumulation or combination of the above.

Figure 14:
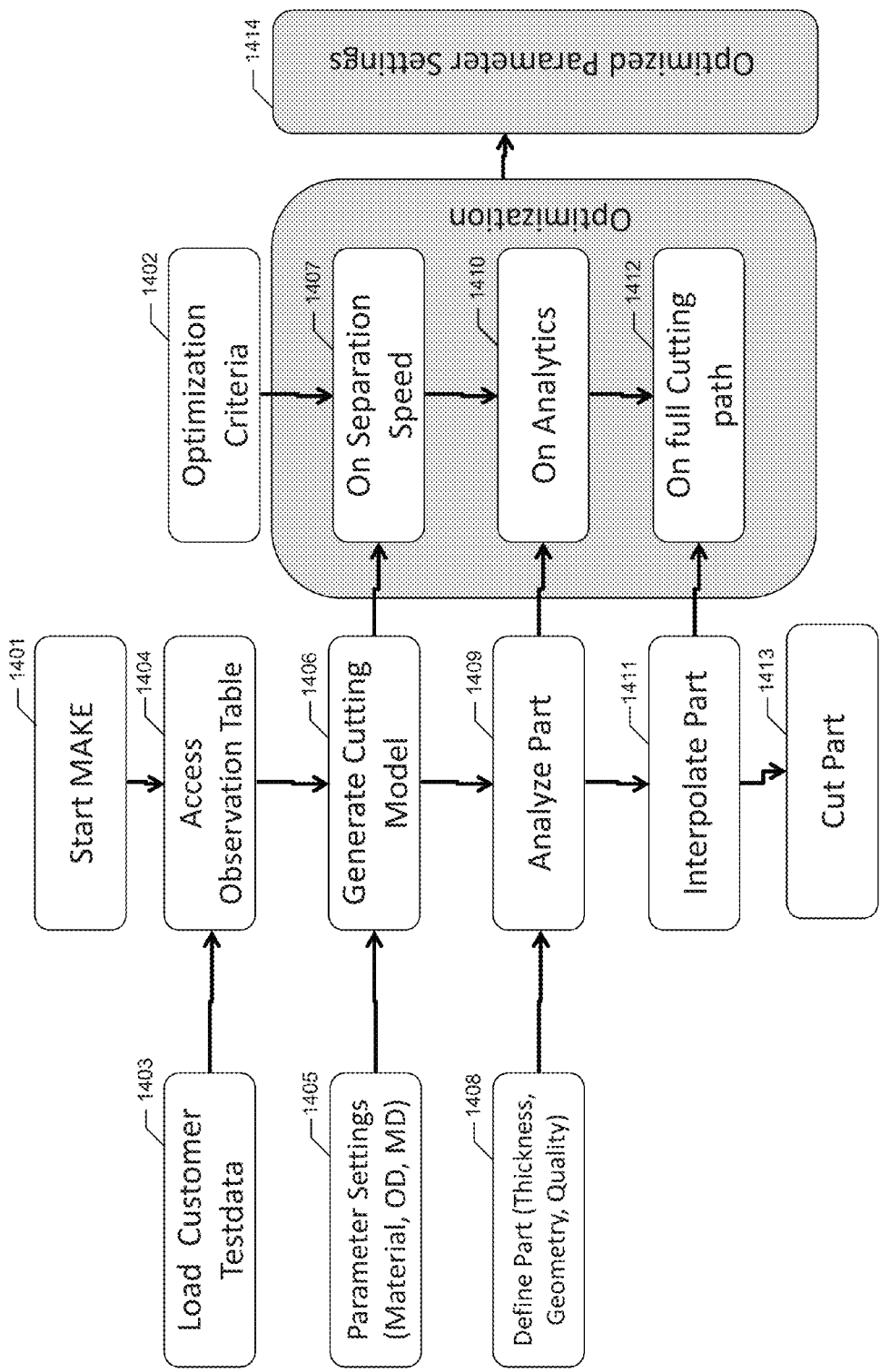
FIG. 14 is a flow diagram showing steps typically performed by the facility in some embodiments in order to provide the advisory function.

FIG. 14 is a flow diagram showing steps typically performed by the facility in some embodiments in order to provide the advisory function. The diagram shows the beginning 1401 of a make process, for which the user provides criteria 1402 describing the factors for which the operating parameters should be optimized. In step 1404, the facility accesses the observation table, which includes observations provided by one or more customers in step 1403. In step 1406, the facility uses observations from the observation table, together with initial parameter settings 1405, to generate a cutting model for these parameter settings.

In the first phase of the advisory function, in step 1407, the facility determines an optimization using only the speed function of the cutting model generated in step 1406. For a known thickness/cutting length combination, the facility calculates cost and performance for each sensible parameter setting or combinations of parameter settings as may be reviewed. This provides a quick estimation of what ranges of parameters should be used in order to limit the scope of the later optimization. In some cases, the optimization produced by the facility in this way is adequate, and the facility skips additional phases of the advisory function.

In some embodiments, as a second phase, with the limited range of parameter that were defined in phase one, the facility defines the part in step 1408, analyzes the geometry of the cutting path for the part in step 1409, and performs optimization on the basis of this analysis in step 1410 from the length and curvature of the cutting path and the number and type of features, the facility derives an estimated relative cutting performance from nominal predicted cutting speeds and, in some embodiments, acceleration profiles. The nominal speed at an entity is the maximum speed that would be allowed in order to achieve the desired quality outcome (surface finish, tolerances etc.). This estimation facilitates comparison of various cutting parameters applied to the same cutting path. While it does not yet give a true prediction of the cutting time, since machine, process, and kinematic specific limitations are not yet applied, it still allows comparison of different parameter settings to a much higher degree than what can be accomplished in the first phase. The second phase can be performed at a fairly high speed even with large file sizes and complex geometries. In some embodiments, the second phase generates a level of optimization sufficient to skip the third phase; otherwise, the facility uses the information obtained in this phase to further limit the range of evaluated parameter variations in phase three.

The third phase is compiling the full cutting path in step 1411, potentially including generation of the full set of motion commands to operate the machine, and performing optimization on this basis in step 1412. In some embodiments, the facility primarily performs compilation of the cutting path with a reduced set of motion control parameters (e.g., only X,Y,Z motion), and then later with the full set of motion parameters (e.g., include angular tilting axes). One useful example here is cutting very thin material with high power jets. At this point the nominal quality speed can be very high, but on small entities like small holes or complex geometries, the machine may not be capable of accelerating to this high speed due to the limited cutting length at each entity. At this point increasing the power of the jet does not translate into faster cutting and it may be advantageous to use two parallel jets instead. With two parallel jets, the nominal speed would be slower, but it would produce two parts at the same time and therefore double the cutting performance. This approach may be fairly time consuming, but ensures a very precise prediction and therefore the best possible optimization. To reduce the amount of time to perform the advisory function the range of parameters under consideration for variation can be limited to a certain range predetermined by the facility based on the previous phases of the advisory function and the physical limitations of the machine, e.g., for a beam cutting tool, such as a waterjet machining system, the horsepower of the pump, available number of carriages with potentially different operating parameters like orifice size, etc. At the end of the advisory function, the facility suggests or implements the resulting optimize parameter settings on the machine in step 1414, and can also cut the part in step 1413 using the generated motion commands.

The advisory function can be performed on the machine controller, a network or distributed on many different computers as in a cloud based system. The advisory function can be a service that is provided at cost (or otherwise, for example under license) to the operator.

It will be appreciated by those skilled in the art that the above-described facility may be straightforwardly adapted or extended in various ways. As one example, in various embodiments, the facility can be operated in connection with various types of beam cutter machine tools, including those identified elsewhere herein, as part of performing material-processing applications of various types, including those identified elsewhere herein. While the foregoing description makes reference to particular embodiments, the scope of the invention is defined solely by the claims that follow and the elements recited therein.

We claim:

1. One or more computer memories collectively storing:
a waterjet cutting model data structure comprising information specifying a cutting model for a distinguished workpiece material that, for each of one or more aspects of a waterjet's effect on a workpiece of the distinguished material, specifies a relation adapted to predict the value of the aspect based on the value of one or more independent variables across a range of at least one of material thicknesses, cutting geometries, and cutting quality levels, wherein one of the aspects is jetlag distance, wherein the information further comprises:
for each of the one or more aspects of a waterjet's effect on a workpiece:
values of each of a plurality of function coefficients that, together with a functional form established for the aspect, constitutes a relation adapted to predict the value of the aspect based on the value of one or more independent variables, wherein the functional form established for the jetlag distance aspect is parabolic; and
contents whose execution by one or more processors causes the one or more processors to:
cause generation of at least one of waterjet cutting tool paths and waterjet cutting tool machine commands for waterjet cutting projects cutting the distinguished material based, at least in part, on the data structure; and
cause the generated at least one of waterjet cutting tool paths and waterjet cutting tool machine commands to be used to perform a cutting project.

2. The computer memories of claim 1 wherein the information specifying a cutting model specifies, for each of the one or more aspects of a waterjet's effect on a workpiece of the distinguished material, a relation adapted to predict the value of the aspect based on the value of one or more independent variables across a range of each of material thicknesses, cutting geometries, operation parameters, and cutting quality levels.

3. A method in a computing system for generating a tool path to cause a waterjet cutting tool to plan a first cutting project on a workpiece of a distinguished material and a second cutting project on a workpiece of the distinguished material, the method comprising:
accessing a definition of the first cutting project specifying a workpiece thickness, a cutting geometry, and a cutting quality level;
accessing a definition of the second cutting project specifying a workpiece thickness, a cutting geometry, and a cutting quality level, wherein at least one of the workpiece thickness, cutting geometry, and cutting quality level specified by the definition of the second cutting project differs from the workpiece thickness, cutting geometry, and cutting quality level specified by the definition of the first cutting project;
accessing a cutting model for the distinguished material that, for each of one or more aspects of a waterjet's effect on a workpiece of the distinguished material, specifies a relation adapted to predict the value of the aspect based on the value of one or more independent variables;
using the accessed cutting model to generate a tool path for the first cutting project;
using the accessed cutting model to generate a tool path for the second cutting project, wherein the accessed cutting model is unchanged between generating the tool path for the first cutting project in generating the tool path for the second cutting project;

causing the tool path generated for the first cutting project to be used to perform the first cutting project; and causing the tool path generated for the second cutting project to be used to perform the second cutting project.

4. The method of claim 3, further comprising interpolating the tool path generated for the first cutting project to obtain waterjet cutting tool machine commands for the first cutting project.

5. The method of claim 3, wherein the workpiece thickness specified by the definition of the second cutting project differs from the workpiece thickness specified by the definition of the first cutting project.

6. The method of claim 3, wherein the cutting geometry specified by the definition of the second cutting project differs from the cutting geometry specified by the definition of the first cutting project.

7. The method of claim 3, wherein the quality level specified by the definition of the second cutting project differs from the quality level specified by the definition of the first cutting project.

8. The computer memories of claim 1 wherein one of the independent variables is depth.

9. The computer memories of claim 1 wherein one of the independent variables is cutting speed.

10. The computer memories of claim 1 wherein one of the aspects is taper distance.

11. The computer memories of claim 1 wherein one of the aspects is separation speed.

12. The computer memories of claim 1 wherein one of the aspects is a function of separation speed.

13. The computer memories of claim 1 wherein at least one of the aspects depends on one or more operating parameters of the waterjet, and is independent of any details of a cutting project other than material type.

14. The computer memories of claim 1 wherein at least one of the aspects depends on one or more details of a cutting project beyond material type.

15. A computer-readable medium having contents configured to cause a computing system to perform a method for generating a tool path to cause a waterjet cutting tool to plan a first cutting project on a workpiece of a distinguished material and a second cutting project on a workpiece of the distinguished material, the method comprising:

accessing a definition of the first cutting project specifying a workpiece thickness, a cutting geometry, and a cutting quality level;

accessing a definition of the second cutting project specifying a workpiece thickness, a cutting geometry, and a cutting quality level, wherein at least one of the workpiece thickness, cutting geometry, and cutting quality level specified by the definition of the second cutting project differs from the workpiece thickness, cutting geometry, and cutting quality level specified by the definition of the first cutting project;

accessing a cutting model for the distinguished material that, for each of one or more aspects of a waterjet's effect on a workpiece of the distinguished material, specifies a relation adapted to predict the value of the aspect based on the value of one or more independent variables;

using the accessed cutting model to generate a tool path for the first cutting project;

using the accessed cutting model to generate a tool path for the second cutting project, wherein the accessed cutting model is unchanged between generating the tool path for the first cutting project in generating the tool path for the second cutting project;

causing the tool path generated for the first cutting project to be used to perform the first cutting project; and causing the tool path generated for the second cutting project to be used to perform the second cutting project.

16. The computer-readable medium of claim 15, the method further comprising interpolating the tool path generated for the first cutting project to obtain waterjet cutting tool machine commands for the first cutting project.

17. The computer-readable medium of claim 15, wherein the workpiece thickness specified by the definition of the second cutting project differs from the workpiece thickness specified by the definition of the first cutting project.

18. The computer-readable medium of claim 15, wherein the cutting geometry specified by the definition of the second cutting project differs from the cutting geometry specified by the definition of the first cutting project.

19. The computer-readable medium of claim 15, wherein the quality level specified by the definition of the second cutting project differs from the quality level specified by the definition of the first cutting project.

* * * * *